US011600224B2

(12) United States Patent
Bai et al.

(10) Patent No.: US 11,600,224 B2
(45) Date of Patent: Mar. 7, 2023

(54) GATE DRIVING CIRCUIT AND DRIVING METHOD THEREOF, DISPLAY PANEL

(71) Applicant: BOE TECHNOLOGY GROUP CO., LTD., Beijing (CN)

(72) Inventors: Xiao Bai, Beijing (CN); Shengji Yang, Beijing (CN); Pengcheng Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 22 days.

(21) Appl. No.: 17/260,254

(22) PCT Filed: Mar. 27, 2020

(86) PCT No.: PCT/CN2020/081875
§ 371 (c)(1),
(2) Date: Jan. 14, 2021

(87) PCT Pub. No.: WO2021/189492
PCT Pub. Date: Sep. 30, 2021

(65) Prior Publication Data
US 2022/0139312 A1 May 5, 2022

(51) Int. Cl.
*G09G 3/00* (2006.01)
*G09G 3/36* (2006.01)
(Continued)

(52) U.S. Cl.
CPC ............ *G09G 3/3225* (2013.01); *G11C 19/28* (2013.01); *G09G 2310/0286* (2013.01); *G09G 2320/0247* (2013.01)

(58) Field of Classification Search
CPC ......... G09G 3/3208; G09G 2300/0426; G09G 2300/0809; G09G 2310/0286; G09G 2310/061
See application file for complete search history.

(56) References Cited

U.S. PATENT DOCUMENTS

| 2011/0102388 A1* | 5/2011 | Chin .................... G09G 3/3677 345/98 |
| 2011/0228894 A1* | 9/2011 | Wang .................... G11C 19/28 377/80 |

(Continued)

FOREIGN PATENT DOCUMENTS

| CN | 103295643 A | * | 9/2013 | ............. G11C 19/28 |
| CN | 104978943 A | * | 10/2015 | ........... G09G 3/3677 |
| CN | 111243487 A | * | 6/2020 | ............... G09G 3/20 |

*Primary Examiner* — Lin Li
(74) *Attorney, Agent, or Firm* — Perilla Knox & Hildebrandt LLP; Kenneth A. Knox

(57) ABSTRACT

The present disclosure relates to the field of display technology, and proposes a gate driving circuit and a driving method thereof, and a display panel. The gate driving circuit includes a plurality of cascaded shift register units and switch unit groups. Each of the shift register units and at least one row of pixel units are correspondingly arranged; and switch unit group are arranged between at least a part of adjacent two shift register units. The switch unit group includes a first switch unit and a second switch unit. The first switch unit is used to turn on the output terminal of the shift register unit of the previous stage and the input terminal of the shift register unit of the adjacent next stage in response to a control signal; and the second switch unit is used to turn on the output terminal of the shift register unit of the previous stage and the output terminal of the shift register unit of the adjacent next stage in response to a control signal, wherein the first switch unit and the second switch unit are turned on selectively during a driving period.

18 Claims, 17 Drawing Sheets

(51) Int. Cl.
  *G09G 3/20* (2006.01)
  *G11C 19/28* (2006.01)
  *G09G 3/32* (2016.01)
  *G09G 3/3225* (2016.01)

(56) References Cited

U.S. PATENT DOCUMENTS

| | | | | |
|---|---|---|---|---|
| 2011/0316833 | A1* | 12/2011 | Chang | G09G 3/20 377/79 |
| 2014/0078124 | A1* | 3/2014 | Chen | G09G 3/3696 345/205 |
| 2015/0116194 | A1* | 4/2015 | Matsui | G11C 19/28 345/100 |
| 2015/0255015 | A1* | 9/2015 | Takahara | G09G 3/3225 345/76 |
| 2016/0027396 | A1* | 1/2016 | Li | G09G 3/3614 345/212 |
| 2016/0027526 | A1* | 1/2016 | Xu | G09G 3/2096 377/64 |
| 2017/0178582 | A1* | 6/2017 | Li | G09G 3/3607 |
| 2017/0256196 | A1* | 9/2017 | Yang | G09G 3/2092 |
| 2019/0066560 | A1* | 2/2019 | Mi | G11C 19/28 |
| 2019/0279589 | A1* | 9/2019 | Kusumi | G09G 3/3677 |
| 2020/0234621 | A1* | 7/2020 | Mi | G09G 3/3266 |
| 2020/0394950 | A1* | 12/2020 | Oh | G09G 3/2092 |
| 2021/0350733 | A1* | 11/2021 | Liu | G09G 3/035 |

* cited by examiner under a first driving mode, inputting a first initial signal to an input terminal of a first stage shift register, and inputting a first logic level to a first control signal terminal, a second control signal terminal, and a third control signal terminal, to turn on the first switch units in the first to seventh stage switch unit groups and simultaneously turn off the second switch units in the first to seventh stage switch unit groups under a second driving mode, inputting a second initial signal to the input terminal of the first stage shift register, and inputting a second logic level to the first control signal terminal, to turn on the second switch units in the first, third, fifth and seventh stage switch unit groups, and simultaneously inputting a first logic level to the second control signal terminal and the third control signal terminal, to turn on the first switch units in the second, sixth and fourth stage switch unit groups under a third driving mode, inputting a third initial signal to the input terminal of the first stage shift register, and inputting a second logic level to the first control signal terminal and the second control signal terminal, to turn on the second switch units in the first, third, fifth, seventh, second and sixth stage switch unit groups, and simultaneously inputting a first logic level to the third control signal terminal, to turn on the first switch unit in the fourth stage switch unit group under a fourth driving mode, inputting a fourth initial signal to the input terminal of the first stage shift register, and inputting a second logic level to the first control signal terminal, the second control signal terminal, and the third control signal terminal, to turn on the second switch units in the first to seventh stage switch unit groups and simultaneously turn off the first switch units in the first to seventh stage switch unit groups

FIG. 24

GATE DRIVING CIRCUIT AND DRIVING METHOD THEREOF, DISPLAY PANEL

CROSS-REFERENCE TO RELATED APPLICATION

This application is a 35 U.S.C. § 371 national phase application of International Application No. PCT/CN2020/081875 filed Mar. 27, 2020, the contents of which being incorporated by reference in their entirety herein.

TECHNICAL FIELD

The present disclosure relates to the field of display technology, in particular to a gate driving circuit and a driving method thereof, and a display panel.

BACKGROUND

A display panel displays images in a manner of sequentially displaying one frame by one frame. Due to mutual interference between frames, the display panel usually will be dynamic blur when displaying images. In the related art, a black picture is usually inserted between display of the frames to improve the problem of dynamic blur of the image. However, the manner of inserting the black picture will reduce display duration of a frame of a picture, thereby causing problems such as image flickering and low display brightness.

It should be noted that the information disclosed in the above background section is only used to strengthen the understanding of the background of the present disclosure, and therefore may include information that does not constitute the prior art known to those of ordinary skill in the art.

SUMMARY

According to an aspect of the present disclosure, there is provided a gate driving circuit, applied to a display panel. The display panel includes a plurality of rows of pixel units. The gate driving circuit includes: a plurality of shift register units and switch unit groups. The shift register units are arranged in cascade, an output terminal of the shift register unit of a previous stage is connected to an input terminal of the shift register unit of an adjacent next stage, each of the shift register units and at least one row of pixel units are correspondingly arranged, for inputting an enable signal to the corresponding at least one row of pixel units; switch unit groups are arranged between at least a part of adjacent two shift register units, and the switch unit group including: a first switch unit, and a second switch unit. The first switch unit is connected to an output terminal of the shift register unit of a previous stage and an input terminal of the shift register unit of an adjacent next stage, to turn on the output terminal of the shift register unit of the previous stage and the input terminal of the shift register unit of the adjacent next stage in response to a control signal; the second switch unit is connected to an output terminal of the shift register unit of a previous stage and an output terminal of the shift register unit of an adjacent next stage, to turn on the output terminal of the shift register unit of the previous stage and the output terminal of the shift register unit of the adjacent next stage in response to a control signal, wherein the first switch unit and the second switch unit are turned on selectively during a driving period.

In an exemplary embodiment of the present disclosure, the first switch unit is further connected to a control signal terminal, for turning on the output terminal of the shift register unit of the previous stage and the input terminal of the shift register unit of the adjacent next stage in response to a signal of the control signal terminal; the second switch unit is further connected to the control signal terminal, for turning on the output terminal of the shift register unit of the previous stage and the output terminal of the shift register unit of the adjacent next stage in response to a signal of the control signal terminal, wherein logics of turn-on levels of the first switch unit and the second switch unit are opposite.

In an exemplary embodiment of the present disclosure, each of the shift register units corresponds to a row of pixel units and is used to provide an enable signal to the corresponding row of pixel units.

In an exemplary embodiment of the present disclosure, each of the shift register units corresponds to a plurality of rows of pixel units, and is used to provide an enable signal to the corresponding plurality of rows of pixel units.

In an exemplary embodiment of the present disclosure, one switch unit group is arranged between each of adjacent shift registers, wherein a switch unit group of an N-th stage is arranged between a shift register unit of an N-th stage and a shift register unit of an (N+1)-th stage, and N is a positive integer greater than or equal to 1.

In an exemplary embodiment of the present disclosure, there are $m*2^n$ shift register units, wherein m is a positive integer greater than or equal to 2, and n is a positive integer greater than or equal to 1; switch unit groups of (km+M)-th stages are commonly connected to a first control signal terminal, k is a positive integer greater than or equal to 0, M is a positive integer less than m and greater than 0, and km+M is less than or equal to $m*2^n$; switch unit groups of $(2^q*m+2^{q+1}*m*p)$ stages are commonly connected to a (q+2)-th control signal terminal, wherein q and p are positive integers greater than or equal to 0, and $2^q*m+2^{q+1}*m*p$ is less than or equal to $m*2^n$. The first control signal terminal and the (q+2)-th control signal terminal form the control signal terminal.

In an exemplary embodiment of the present disclosure, m is equal to 2, n is equal to 2; the first stage switch unit group, the third stage switch unit group, the fifth stage switch unit group and the seventh stage switch unit group are commonly connected to the first control signal terminal; the second stage switch unit group and the sixth stage switch unit group are commonly connected to the second control signal terminal; and the fourth stage switch unit group is connected to the third control signal terminal.

In an exemplary embodiment of the present disclosure, the output terminal of each shift register unit is connected to a plurality of enable signal lines, and each of the plurality of enable signal lines is used to provide the enable signal to one row of pixel units.

In an exemplary embodiment of the present disclosure, the gate driving circuit further includes: a first power supply terminal; and a plurality of third switch units, arranged in a one-to-one correspondence with the shift register units, and the third switch unit is connected to the first power supply terminal, the output terminal of the shift register unit, and at least one enable signal line, for transmitting the first power supply terminal to the at least one enable signal line in response to a signal from the output terminal of the shift register unit, wherein the at least one enable signal line is used to provide the enable signal to one row of pixel units.

In an exemplary embodiment of the present disclosure, the number of rows of pixel units corresponding to each shift register unit is the same.

In an exemplary embodiment of the present disclosure, the plurality of rows of pixel units corresponding to the same shift register unit is arranged adjacently.

In an exemplary embodiment of the present disclosure, the first switch unit is a P-type transistor, and the second switch unit is an N-type transistor; or the first switch unit is an N-type transistor, and the second switch unit is a P-type transistor.

In an exemplary embodiment of the present disclosure, the first switch unit is a P-type transistor, a gate electrode of the first switch unit is connected to the control signal terminal, the first electrode of the first switch unit is connected to the output terminal of the shift register unit of the previous stage, and the second electrode of the first switch unit is connected to the input terminal of the shift register unit of the adjacent next stage;

the second switch unit is an N-type transistor, a gate electrode of the second switch unit is connected to the control signal terminal, the first electrode of the second switch unit is connected to the output terminal of the shift register unit of the previous stage, and the second electrode of the second switch unit is connected to the output terminal of the shift register unit of the adjacent next stage; or, the first switch unit is an N-type transistor, a gate electrode of the first switch unit is connected to the control signal terminal, the first electrode of the first switch unit is connected to the output terminal of the shift register unit of the previous stage, and the second electrode of the first switch unit is connected to the input terminal of the shift register unit of the adjacent next stage;

the second switch unit is a P-type transistor, a gate electrode of the second switch unit is connected to the control signal terminal, the first electrode of the second switch unit is connected to the output terminal of the shift register unit of the previous stage, and the second electrode of the second switch unit is connected to the output terminal of the shift register unit of the adjacent next stage.

In an exemplary embodiment of the present disclosure, the third switch unit is a switch transistor, a gate electrode of the third switch unit is connected to the output terminal of the shift register unit, and a first electrode of the third switch unit is connected to the first power supply terminal and a second electrode of the third switch unit is connected to the at least one enable signal line.

According to an aspect of the present disclosure, there is provided a driving method of a gate driving circuit, for driving the gate driving circuit described above, including:

in a driving period, selectively turning on a first switch unit or a second switch unit in one switch unit group.

In an exemplary embodiment of the present disclosure, m=2 and n=2, the driving method including:

under a first driving mode, inputting a first initial signal to an input terminal of a first stage shift register, and inputting a first logic level to a first control signal terminal, a second control signal terminal, and a third control signal terminal, to turn on the first switch units in the first to seventh stage switch unit groups and simultaneously turn off the second switch units in the first to seventh stage switch unit groups;

under a second driving mode, inputting a second initial signal to the input terminal of the first stage shift register, and inputting a second logic level to the first control signal terminal, to turn on the second switch units in the first, third, fifth and seventh stage switch unit groups, and simultaneously inputting a first logic level to the second control signal terminal and the third control signal terminal, to turn on the first switch units in the second, sixth and fourth stage switch unit groups;

under a third driving mode, inputting a third initial signal to the input terminal of the first stage shift register, and inputting a second logic level to the first control signal terminal and the second control signal terminal, to turn on the second switch units in the first, third, fifth, seventh, second and sixth stage switch unit groups, and simultaneously inputting a first logic level to the third control signal terminal, to turn on the first switch unit in the fourth stage switch unit group; and under a fourth driving mode, inputting a fourth initial signal to the input terminal of the first stage shift register, and inputting a second logic level to the first control signal terminal, the second control signal terminal, and the third control signal terminal, to turn on the second switch units in the first to seventh stage switch unit groups and simultaneously turn off the first switch units in the first to seventh stage switch unit groups.

According to an aspect of the present disclosure, there is provided a display panel, including the gate driving circuit described above.

In an exemplary embodiment of the present disclosure, the display panel is a silicon-based OLED display panel.

In an exemplary embodiment of the present disclosure, the silicon-based OLED display panel includes: a display area, a first virtual area, a detection area, a second virtual area, a cathode ring area, a third virtual area, a first driving circuit integration area, a second driving circuit integration area. The first virtual area is located around the display area; the detection area is located at a side of the first virtual area away from the display area; the second virtual area is located at a side of the detection area away from the display area; the cathode ring area is located at a side of the second virtual area away from the display area; the third virtual area is located at a side of the cathode ring area away from the display area; the first driving circuit integration area is located at a side of the third virtual area away from the display area, for integrating a first gate driving circuit, wherein the first gate driving circuit is used for generating a gate driving signal; and the second driving circuit integration area is located at a side of the first driving circuit integration area away from the display area, for integrating the gate driving circuit described above.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the disclosure, and explain the principle of the disclosure together with the specification. Obviously, the drawings in the following description are only some embodiments of the present disclosure. For those of ordinary skill in the art, other drawings can be obtained based on these drawings without creative work.

DETAILED DESCRIPTION

Figure 1:
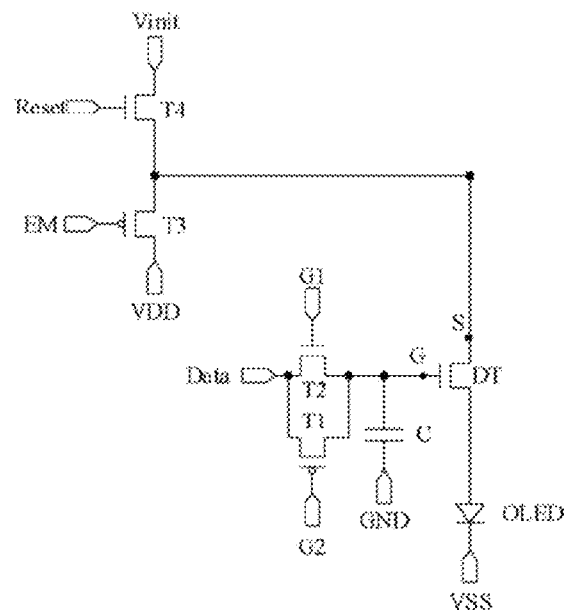
FIG. 1 is a schematic structural diagram of a pixel driving circuit of the present disclosure.

Example embodiments will now be described more fully with reference to the accompanying drawings. However, the example embodiments can be implemented in various forms, and should not be construed as being limited to the examples set forth herein; on the contrary, the provision of these embodiments makes the present disclosure more comprehensive and complete, and fully conveys the concept of the example embodiments to those skilled in the art. The described features, structures or characteristics may be combined in one or more embodiments in any suitable way. In the following description, many specific details are provided to give a sufficient understanding of the embodiments of the present disclosure. However, those skilled in the art will realize that the technical solutions of the present disclosure can be practiced without one or more of the specific details, or other methods, components, apparatuses, steps, etc. can be used. In other cases, well-known technical solutions are not shown or described in detail to avoid distracting and obscuring all aspects of the present disclosure.

In addition, the drawings are only schematic illustrations of the present disclosure, and are not necessarily drawn to scale. The same reference numerals in the drawings denote the same or similar parts, and thus their repeated description will be omitted. Some of the block diagrams shown in the drawings are functional entities and do not necessarily correspond to physically or logically independent entities. These functional entities may be implemented in the form of software, or implemented in one or more hardware modules or integrated circuits, or implemented in different networks and/or processor devices and/or microcontroller devices.

The terms "a", "an", "the" and "said" are used to indicate the presence of one or more elements/components/etc.; the terms "include" and "have" are used to indicate open-ended inclusion and means that there may be other elements/components/etc. in addition to the listed elements/components/etc.; the terms "first" and "second" etc. are only used as marks, not to limit the quantity of the objects.

Figure 2:
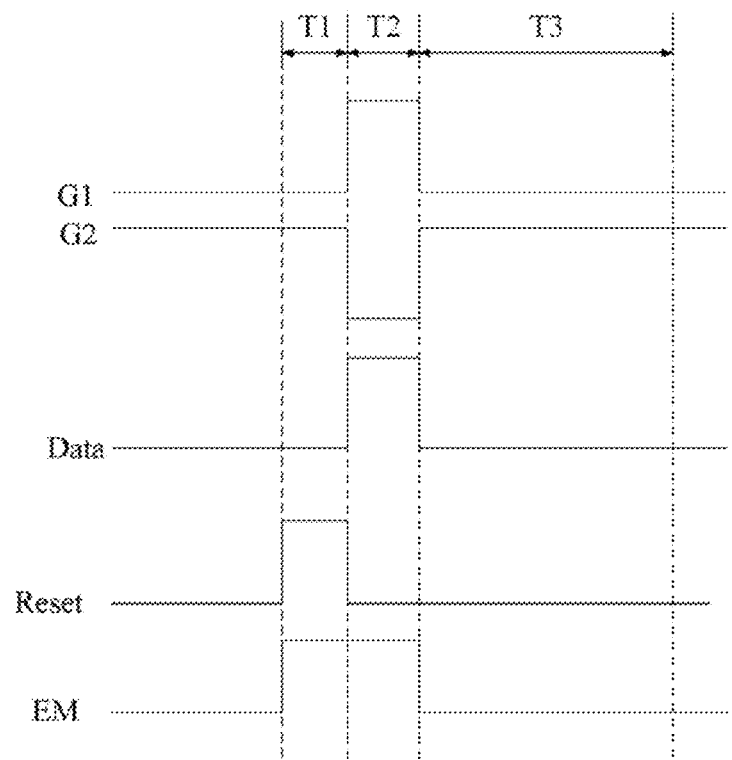
FIG. 2 is a timing diagram of some nodes in an exemplary embodiment of the pixel driving circuit of FIG. 1.
Figure 3:
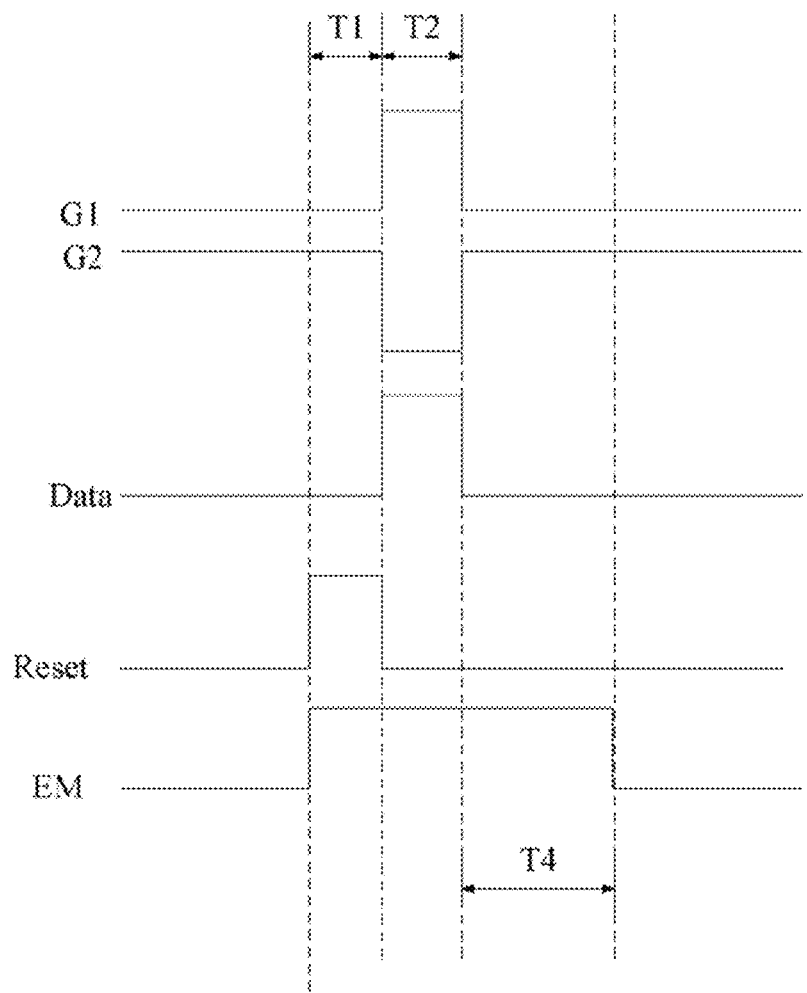
FIG. 3 is a timing diagram of some nodes in another exemplary embodiment of the pixel driving circuit of FIG. 1.

As shown in FIGS. 1 and 2, FIG. 1 is a schematic structural diagram of a pixel driving circuit of the present disclosure; FIG. 2 is a timing diagram of some nodes in an exemplary embodiment of the pixel driving circuit of FIG. 1. The pixel driving circuit may include a first P-type transistor T1, a second N-type transistor T2, a driving transistor DT, a third P-type transistor T3, a fourth N-type transistor T4, a capacitor C, and a light-emitting unit OLED. A control terminal of the first P-type transistor T1 is connected to a second control terminal G2, a first terminal of the first P-type transistor T1 is connected to is connected to a data signal terminal Data, and a second terminal of the first P-type transistor T1 is connected to is connected to a node G. A control terminal of the second N-type transistor T2 is connected to a first control terminal G1, a first terminal of the second N-type transistor T2 is connected to the data signal terminal Data, a second terminal of the second N-type transistor T2 is connected to the node G. A control terminal of the third P-type transistor T3 is connected to an enable signal terminal EM, a first terminal of the third P-type transistor T3 is connected to a node S, and a second terminal of the third P-type transistor T3 is connected to a first power supply VDD. A control terminal of the fourth N-type transistor T4 is connected to a reset signal terminal Reset, a first terminal of the fourth N-type transistor T4 is connected to an initialization signal terminal Vinit, a second terminal of the fourth N-type transistor T4 is connected to the node S. A control terminal of the driving transistor DT is connected to the node G, a first terminal of the driving transistor DT is connected to the node S, and the light-emitting power supply OLED is connected between a second power source terminal VSS and a second terminal of the driving transistor DT. The capacitor is connected between the ground terminal GND and the node G. The driving method of the pixel driving circuit includes: a reset phase, a data writing phase, and a light-emitting phase. As shown in FIG. 2, in the reset phase T1: the reset signal terminal Reset is at a high level, and the fourth N-type transistor T4 is turned on under action of the high level of the reset signal terminal Reset, so that the initial signal terminal Vinit resets the node S. In the data writing stage T2: the data signal terminal Data is a high level signal, the first control terminal G1 is a high level signal, the second control terminal G2 is a low level signal, and the enable signal terminal EM is a high level signal. The third P-type transistor T3 is turned off under action of the high level of the enable signal terminal EM, the first P-type transistor T1 is turned on under action of the low level of the second control terminal G2, and the second N-type transistor T2 is turned on under action of the high level of the first control terminal G1, to transmit the high level signal of the data signal terminal Data to the node G and store it in the capacitor C. In the light-emitting phase T3, the enable signal terminal EM is a low level signal. The third P-type transistor T3 is turned on under action of the low level of the enable signal terminal EM, to make the light-emitting unit OLED emit light. The signal of the enable signal terminal EM can adjust the light-emitting duration of the pixel unit. For example, as shown in FIG. 3, a timing diagram is shown of some nodes in another exemplary embodiment of the pixel driving circuit of FIG. 1. During the T4 period, the enable signal EM can be continuously at a high level, so that the light-emitting unit OLED is in the off state, and the black screen can be inserted between frames by controlling the duration of T4. Specifically, from the reset stage of the pixel unit of the first row of the display panel to the data writing stage of the pixel unit of the last row, the enable signal received by each pixel driving circuit remains a high level. During this time period, each pixel unit does not emit light, the display panel is in the black insertion stage; after the last row of pixel units completes the data writing stage, the enable signal received by each pixel driving circuit turns to a low level. At this time, all pixel units of the display panel emit light at the same time, and the display panel is in the light-emitting stage.

However, due to limitations such as the refresh frequency of the display panel, IC response time, duration of the reset phase and the compensation phase of each row of pixel units (the reset phase and the compensation phase can be collectively referred to as the data writing phase), the actual light-emitting duration of the display panel is relatively small, which causes problems such as flickering of images of the display panel and low display brightness or the like.

Figure 4:
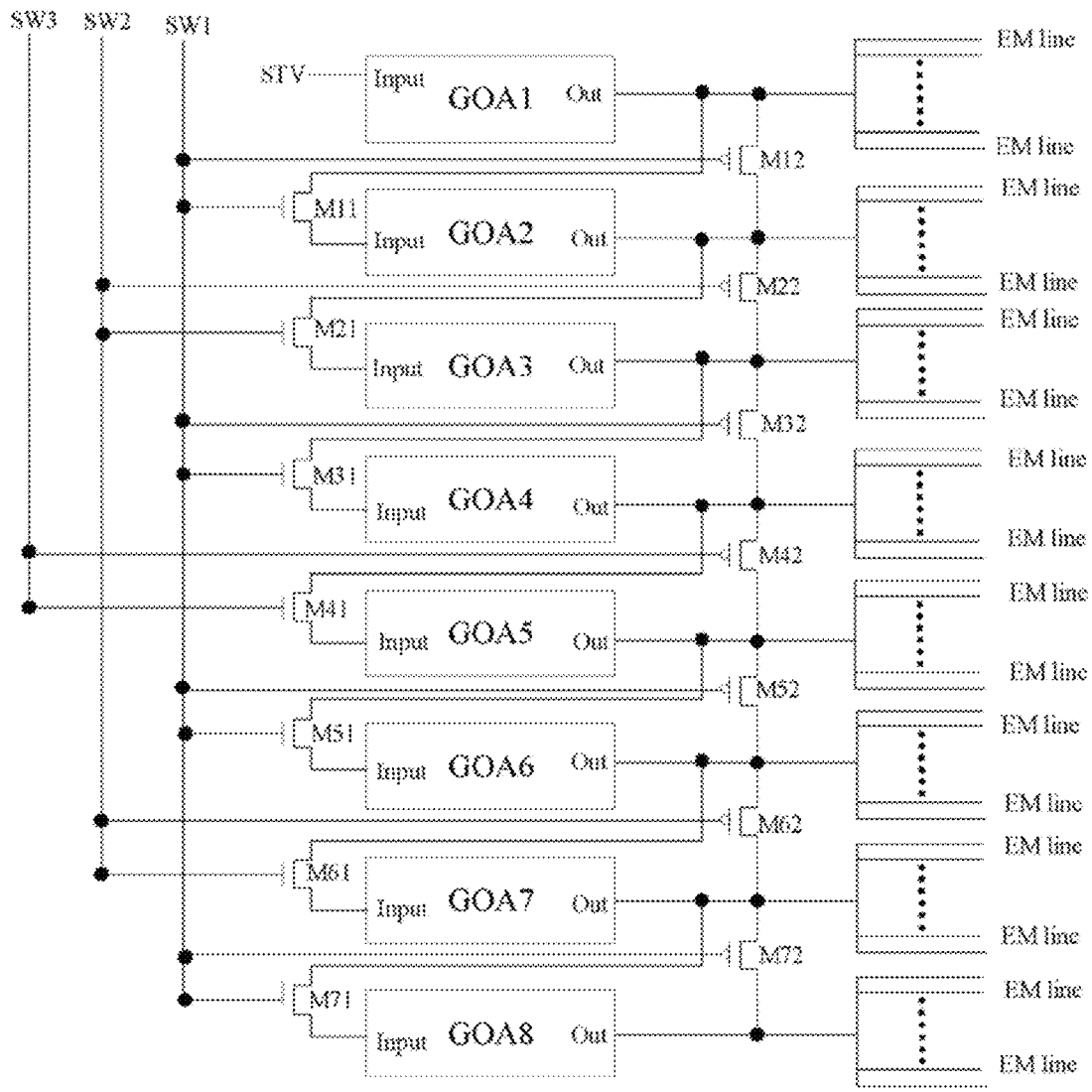
FIG. 4 is a schematic structural diagram of an exemplary embodiment of a gate driving circuit of the present disclosure.

Based on this, the exemplary embodiment provides a gate driving circuit. As shown in FIG. 4, a schematic structural diagram of an exemplary embodiment of a gate driving circuit of the present disclosure is illustrated. The gate driving circuit may be applied to a display panel. The display panel includes a plurality of rows of pixel units, and the gate driving circuit may include eight shift register units GOA1-GOA8 and seven switch unit groups. The eight shift register units are arranged in cascade, an output terminal Out of the shift register unit of a previous stage is connected to an input terminal Input of the shift register unit of an adjacent next stage. The output terminal Out of each of the shift register units and the plurality of rows of pixel units may be correspondingly arranged, to simultaneously input an enable signal to the plurality of rows of the pixel units. A switch unit group may be arranged between each adjacent shift register unit. A switch unit group of an N-th stage is arranged between a shift register unit of an N-th stage and a shift register unit of an (N+1)-th stage. In the embodiment, the first stage switch unit group includes a first switch unit M11 and a second switch unit M12, the second stage switch unit group includes a first switch unit M21 and a second switch unit M22, the third stage switch unit group includes a first switch unit M31 and a second switch unit M32, the fourth stage switch unit group includes a first switch unit M41 and a second switch unit M42, the fifth stage switch unit group includes a first switch unit M51 and a second switch unit M52, the sixth stage switch unit group includes a first switch unit M61 and a second switch unit M62, and the seventh stage switch unit group includes a first switch unit M71 and a second switch unit M72. Each switch unit group is correspondingly connected to a control signal terminal. The first stage switch unit group, the third stage switch unit group, the fifth stage switch unit group and the seventh stage switch unit group are commonly connected to the first control signal terminal SW1; the second stage switch unit group and the sixth stage switch unit group are commonly connected to the second control signal terminal SW2; and the fourth stage switch unit group is connected to the third control signal terminal SW3. The first switch unit in each switch unit group is connected to an output terminal Out of the shift register unit of a previous stage, an input terminal Input of the shift register unit of an adjacent next stage and a control signal terminal, for turning on the output terminal of the shift register unit of the previous stage and the input terminal of the shift register unit of the adjacent next stage in response to a signal of the control signal terminal. The second switch unit in each switch unit group is connected to an output terminal Out of the shift register unit of a previous stage, an output terminal Out of the shift register unit of an adjacent next stage, and the control signal terminal, for turning on the output terminal of the shift register unit of the previous stage and the output terminal of the shift register unit of the adjacent next stage in response to a signal of the control signal terminal. Logics of turn-on levels of the first switch unit and the second switch unit are opposite. The pixel units of the same row may refer to pixel units connected to the same gate line.

As shown in FIG. 4, in this exemplary embodiment, the output terminal Out of each shift register unit may be connected to a plurality of enable signal lines (EM line), and each enable signal line is used to provide the enable signal to a row of pixel units. The number of enable signal lines connected to each shift register unit may be the same, and the enable signal lines connected to the same shift register unit may be arranged adjacently. In other exemplary embodiments, logics of the turn-on levels of the first switch unit and the second switch unit may also be the same. In a driving period, the first switch unit and the second switch unit may be selectively turned on under action of different control signal terminals. The driving period is the driving period of the gate driving circuit.

In this exemplary embodiment, as shown in FIG. 4, the first switch units M11, M21, M31, M41, M51, M61, and M71 may be N-type transistors, and the second switch units M12, M22, M32, M42, M52, M62 and M72 may be P-type transistors. It should be understood that, in other exemplary embodiments, the first switch units M11, M21, M31, M41, M51, M61, and M71 may also be P-type transistors, and the second switch units M12, M22, M32, M42, M52, M62, M72 may also be N-type transistors.

Figure 5:
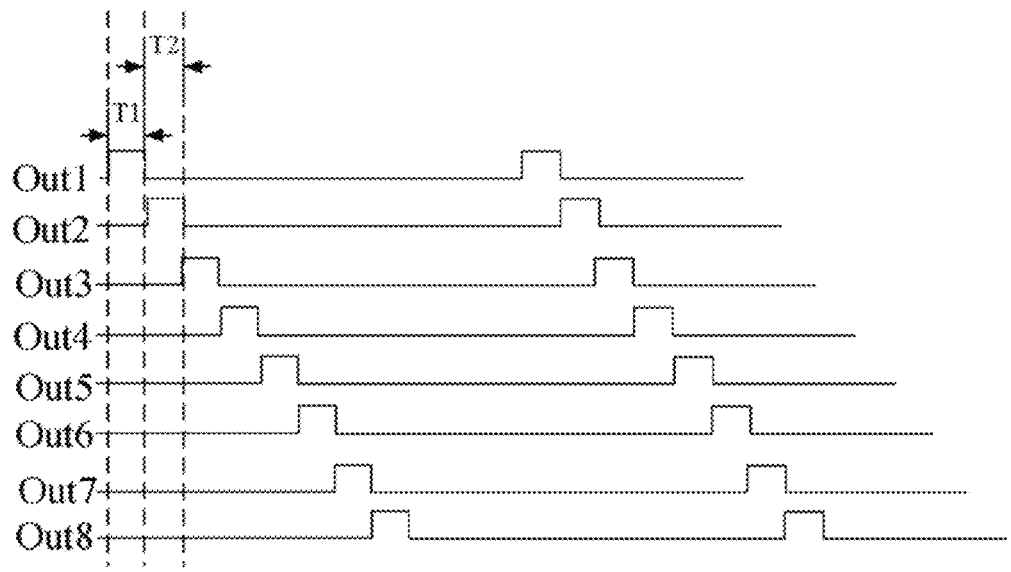
FIG. 5 is a timing diagram of each node of the gate driving circuit of the present disclosure.
Figure 6:
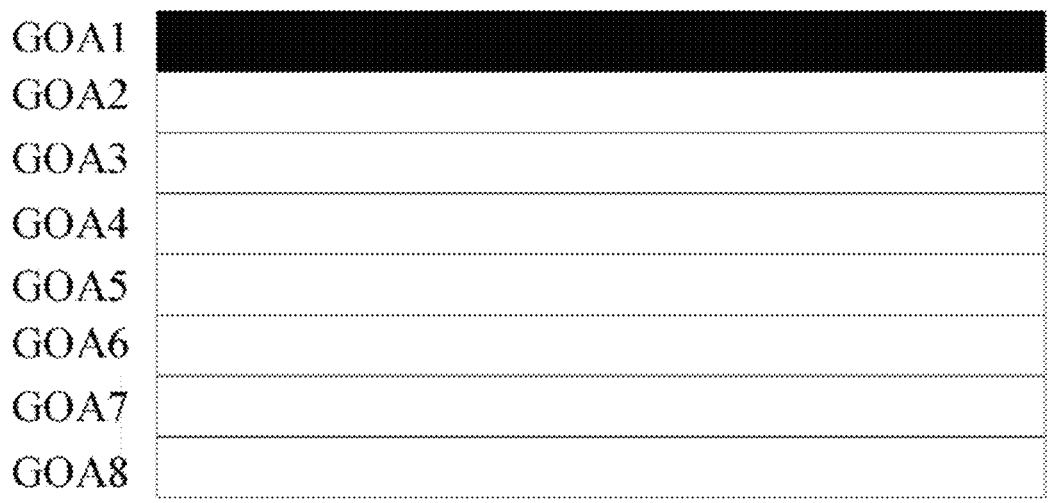
FIG. 6 is a display state diagram of the display panel in the T1 time period.
Figure 7:
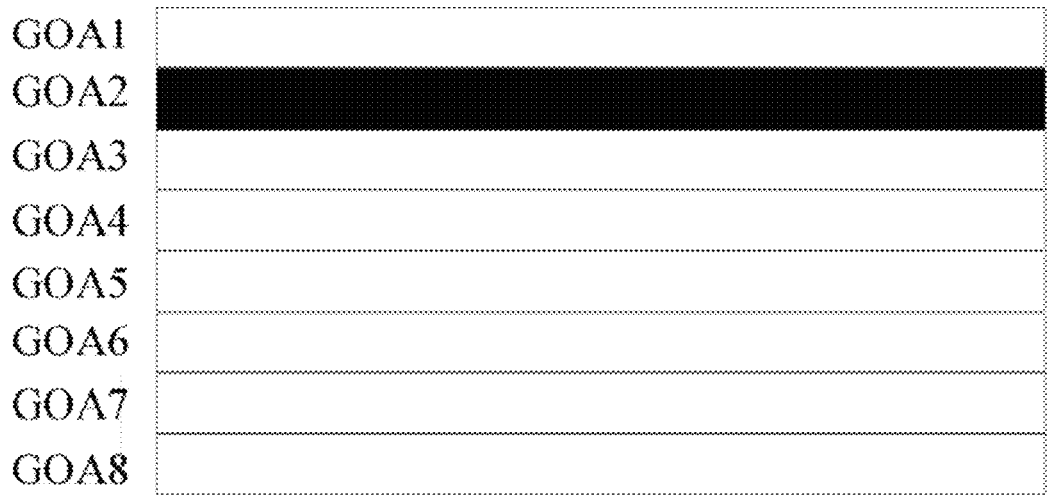
FIG. 7 is a diagram of the display state of the display panel in the T2 time period.

The gate driving circuit shown in FIG. 4 can be switched under four operating modes, as shown in FIG. 24. Under a first driving mode, a first initial signal may be input to an input terminal Input of a first stage shift register, and a first logic level may be input to a first control signal terminal, a second control signal terminal, and a third control signal terminal, to turn on the first switch units in the first to seventh stage switch unit groups and simultaneously turn off the second switch units in the first to seventh stage switch unit groups. In the embodiment, the first logic level may be a high level. Under the first mode, as shown in FIG. 5, a timing diagram is shown of each node of the gate driving circuit of the present disclosure, where Out1 is the timing diagram of the output terminal of the first stage shift register unit GOA1; Out2 is the timing diagram of the output terminal of the second stage shift register unit GOA2; Out3 is the timing diagram of the output terminal of the third stage shift register unit GOA3; Out4 is the timing diagram of the output terminal of the fourth stage shift register unit GOA4; Out5 is the timing diagram of the output terminal of the fifth stage shift register unit GOA5; Out6 is the timing diagram of the output terminal of the sixth stage shift register unit GOA6; Out7 is the timing diagram of the output terminal of the seventh stage shift register unit GOA7; and Out8 is the timing diagram of the output terminal of the eighth stage shift register unit GOA8. The plurality of shift register units sequentially shift and output high level signals. In the T1 time period, the first stage shift register unit GOA outputs a high level signal under action of the initialization signal. As shown in FIG. 6, the display state diagram of the display panel in the T1 time period is shown, where GOAn is the pixel unit area correspondingly connected with the n-th stage shift register unit. In the T1 time period, the pixel units in the GOA1 area receive a high level enable signal. Therefore, the pixel units in the GOA1 area do not emit light during the T1 time period, that is, the GOA1 area is inserted in black. As shown in FIG. 7, a display state diagram of the display panel in the T2 time period is shown, where GOAn is the pixel unit area connected to the n-th stage shift register unit. In the T2 period, the second stage shift register unit outputs a high level signal, and the pixel unit correspondingly connected with the second stage shift register unit receives a high level enable signal. In the T2 period, the pixel units in the GOA2 area do not emit light, that is, the GOA2 area is inserted in black. By analogy, under the first driving mode, each pixel area corresponding to the shift register unit is inserted in black sequentially and scrolledly.

Under a second driving mode, a second initial signal is input to the input terminal Input of the first stage shift register, and a second logic level is input to the first control signal terminal, to turn on the second switch units in the first, third, fifth and seventh stage switch unit groups, and turn off the first switch units in the first, third, fifth and seventh stage switch unit groups; and simultaneously a first logic level is input to the second control signal terminal and the third control signal terminal, to turn on the first switch units in the second, sixth and fourth stage switch unit groups, and turn off the second switch units in the second, sixth and fourth stage switch unit groups. In the embodiment, the first logic level is a high level, and the second logic level is a low level. Under the second driving mode, the input terminals of the second stage shift register GOA2, the fourth stage shift register GOA4, and the sixth stage shift register GOA6 cannot receive the output signal of the shift register of the previous stage. Therefore, the second stage shift register GOA2, the fourth stage shift register GOA4, and the sixth stage shift register GOA6 do not output shift signals. At the same time, since the input terminal of the first stage shift register unit is connected to the output terminal of the second stage shift register unit, the first stage shift register unit may provide a enable signal to the plurality of rows of pixel units corresponding to the second stage shift register unit; since the input terminal of the third stage shift register unit is connected to the output terminal of the fourth stage shift register unit, the third stage shift register unit may further provide a enable signal to the plurality of rows of pixel units corresponding to the fourth stage shift register unit; since the input terminal of the fifth stage shift register unit is connected to the output terminal of the sixth stage shift register unit, the fifth stage shift register unit may further provide a enable signal to the plurality of rows of pixel units corresponding to the sixth stage shift register unit; and since the input terminal of the seventh stage shift register unit is connected to the output terminal of the eighth stage shift register unit, the seventh stage shift register unit may further provide a enable signal to the plurality of rows of pixel units corresponding to the eighth stage shift register unit.

Figure 8:
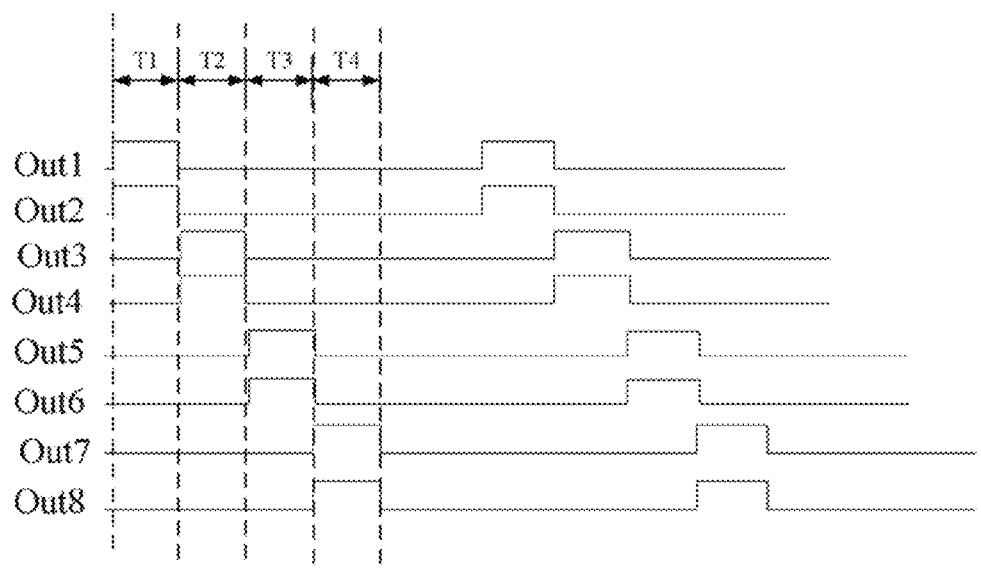
FIG. 8 is a timing diagram of each node of the gate driving circuit shown in FIG. 4 under a second driving state.
Figure 9:
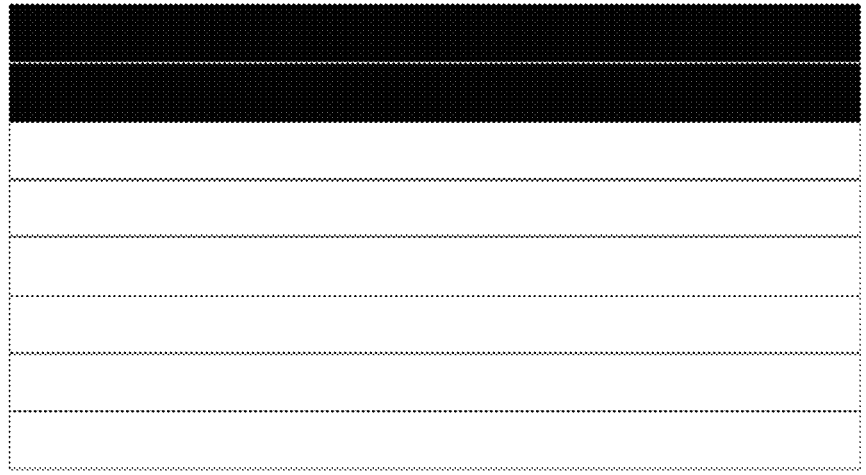
FIG. 9 is a display state diagram of the display panel in the T1 time period.
Figure 10:
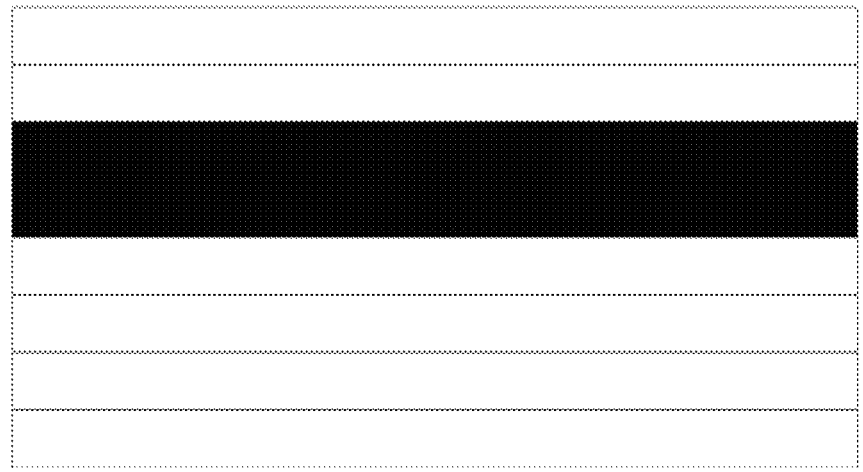
FIG. 10 is a diagram of the display state of the display panel in the T2 time period.

As shown in FIG. 8, a timing diagram is shown of each node of the gate driving circuit shown in FIG. 4 under the second driving state, where Out1 is the timing diagram of the output terminal of the first stage shift register unit GOA1; Out2 is the timing diagram of the output terminal of the second stage shift register unit GOA2; Out3 is the timing diagram of the output terminal of the third stage shift register unit GOA3; Out4 is the timing diagram of the output terminal of the fourth stage shift register unit GOA4; Out5 is the timing diagram of the output terminal of the fifth stage shift register unit GOA5; Out6 is the timing diagram of the output terminal of the sixth stage shift register unit GOA6; Out7 is the timing diagram of the output terminal of the seventh stage shift register unit GOA7; and Out8 is the timing diagram of the output terminal of the eighth stage shift register unit GOA8. As shown in FIG. 8, in the T1 time period, the output terminal of the first stage shift register unit GOA1 outputs a high level signal. As shown in FIG. 9, it is the display state diagram of the display panel in the T1 time period, where GOAn is the pixel unit area connected with the n-th stage shift register unit. In the T1 time period, the first stage shift register unit outputs a high level signal, and the pixel units correspondingly connected with the first stage shift register unit and the second stage shift register unit receive the high level enable signal. In the T1 period, the pixel units in the GOA1 and GOA2 areas do not emit light, that is, the GOA1 and GOA2 regions are inserted in black. As shown in FIG. 10, it is a display state diagram of the display panel in the T2 time period, where GOAn is the pixel unit area connected to the n-th stage shift register unit. In the T2 time period, the third stage shift register unit outputs a high level signal, and the pixel units correspondingly connected with the third stage shift register unit and the fourth stage shift register unit receives the high level enable signal. In the T2 time period, the pixel units in the GOA3 and GOA4 areas do not emit light, that is, the GOA3 and GOA4 regions are inserted in black. By analogy, in the T3 time period, the pixel units correspondingly connected with the fifth stage shift register unit and the sixth stage shift register unit do not emit light, that is, in the T3 time period, the GOA5 and GOA6 areas are inserted in black. In the T4 time period, the pixel units correspondingly connected with the seventh stage shift register unit and the eighth stage shift register unit do not emit light, that is, in the T4 time period, the GOA7 and GOA8 areas are inserted in black.

Under a third driving mode, a third initial signal is input to the input terminal of the first stage shift register, and a second logic level is input to the first control signal terminal and the second control signal terminal, to turn on the second switch units in the first, third, fifth, seventh, second and sixth stage switch unit groups, and turn off the first switch units in the first, third, fifth, seventh, second and sixth stage switch unit groups; and a first logic level is simultaneously input to the third control signal terminal, to turn on the first switch unit in the fourth stage switch unit group and turn off the second switch unit in the fourth stage switch unit group. In the embodiment, the first logic level is a high level, and the second logic level is a low level. Under the third driving mode, only the input terminal of the fifth stage shift register unit may receive the signal from the output terminal of the first stage shift register unit, the second, third, fourth, sixth, seventh, and eighth stage shift register units do not output shift signals. At the same time, since the output terminal of the first stage shift register unit is connected to the input terminals of the second, third and fourth stage shift register units, the first stage shift register unit may also provide enable signals to the plurality of rows of pixel units corresponding to the second, third and fourth stage shift register units; since the output terminal of the fifth stage shift register unit is connected to the input terminals of the sixth, seventh and eighth stage shift register units, the fifth stage shift register unit may also provide enable signals to the plurality of rows of pixel units corresponding to the sixth, seventh and eighth stage shift register units.

Figure 11:
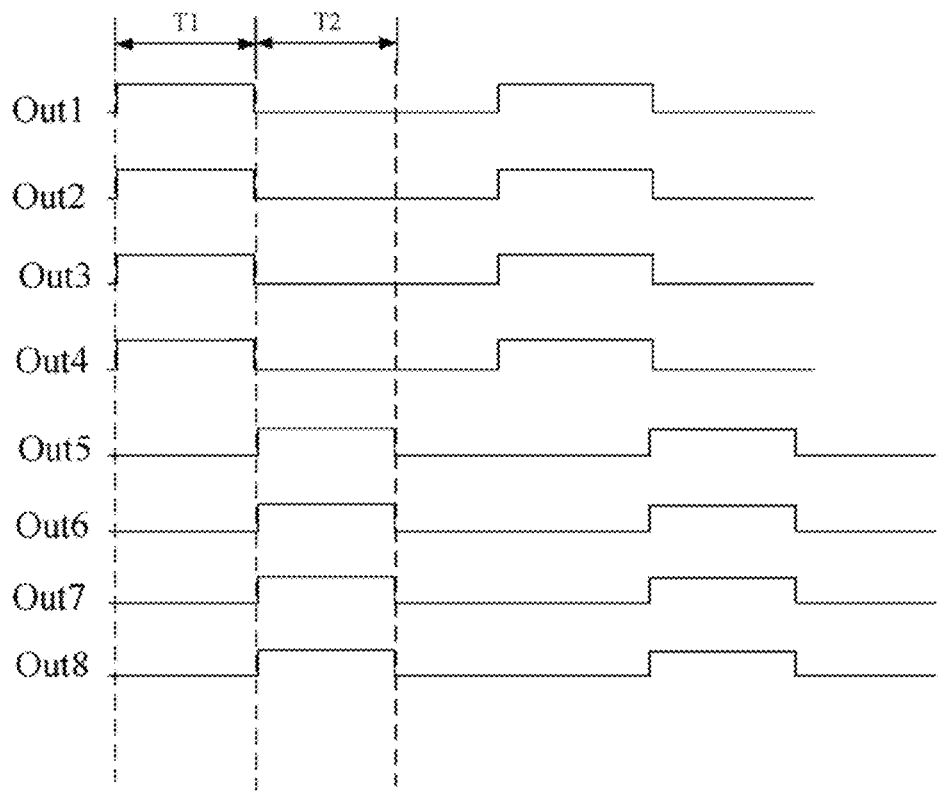
FIG. 11 is a timing diagram of each node of the gate driving circuit shown in FIG. 4 under a third driving state.
Figure 12:
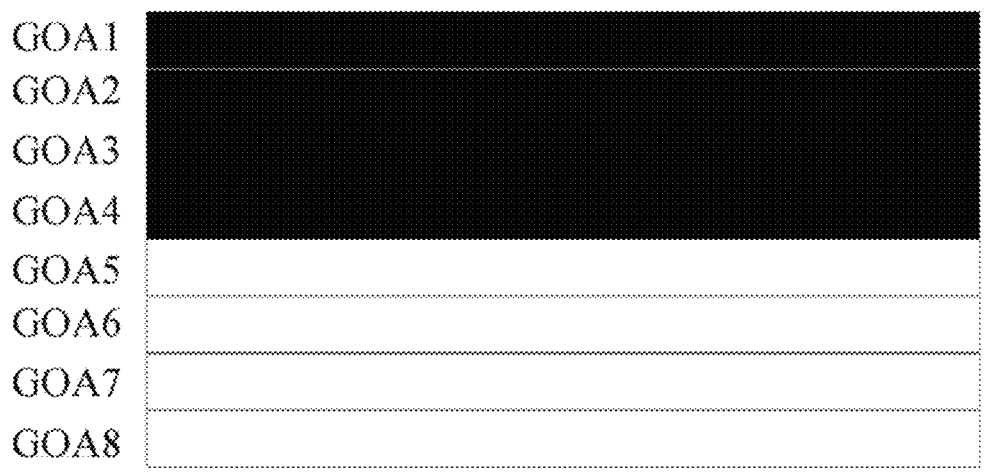
FIG. 12 is a diagram of the display state of the display panel in the T1 time period.
Figure 13:
FIG. 13 is a diagram of the display state of the display panel in the T2 time period.
Figure 14:
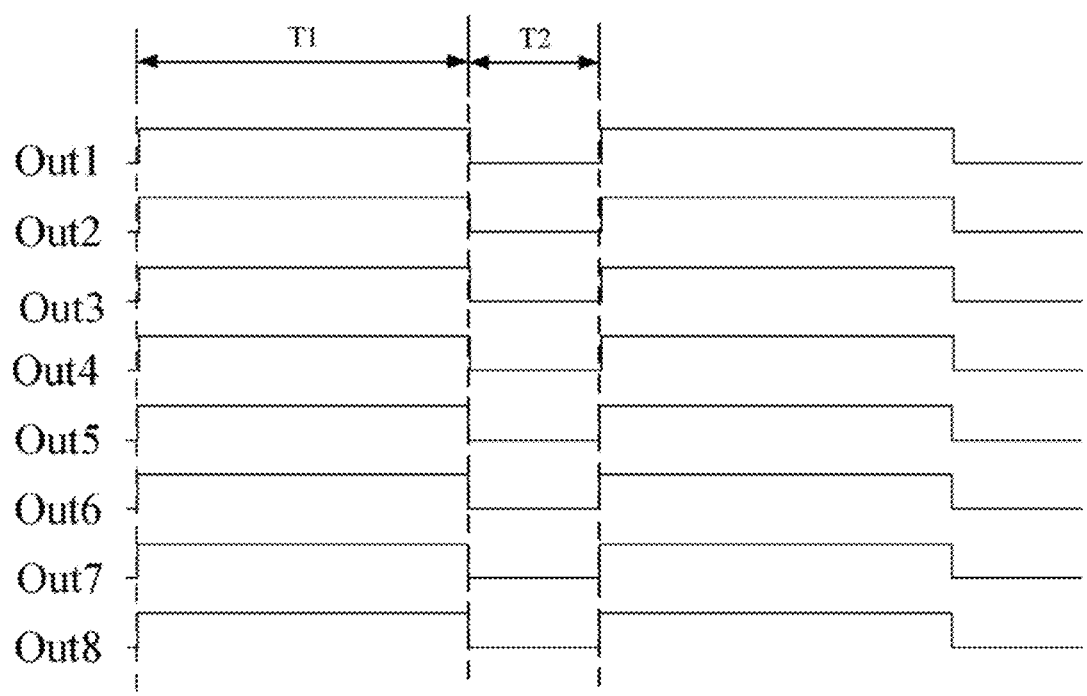
FIG. 14 is a timing diagram of each node of the gate driving circuit shown in FIG. 4 under a fourth driving state.

As shown in FIG. 11, it is a timing diagram of each node of the gate driving circuit shown in FIG. 4 under the third driving state, where Out1 is the timing diagram of the output terminal of the first stage shift register unit GOA1; Out2 is the timing diagram of the output terminal of the second stage shift register unit GOA2; Out3 is the timing diagram of the output terminal of the third stage shift register unit GOA3; Out4 is the timing diagram of the output terminal of the fourth stage shift register unit GOA4; Out5 is the timing diagram of the output terminal of the fifth stage shift register unit GOA5; Out6 is the timing diagram of the output terminal of the sixth stage shift register unit GOA6; Out7 is the timing diagram of the output terminal of the seventh stage shift register unit GOA7; and Out8 is the timing diagram of the output terminal of the eighth stage shift register unit GOA8. As shown in FIG. 14, in the T1 time period, the output terminal of the first stage shift register unit GOA1 outputs a high level signal. As shown in FIG. 12, it is the display state diagram of the display panel in the T1 time period, where GOAn is the pixel unit area connected with the n-th stage shift register unit. In the T1 time period, the first stage shift register unit outputs a high level signal, and the pixel units in the GOA1, GOA2, GOA3, and GOA4 areas receive a high level enable signal. Therefore, in the T1 period, the pixel units in the GOA1, GOA2, GOA3 and GOA4 areas do not emit light, that is, in the T1 period, the GOA1, GOA2, GOA3, and GOA4 areas are inserted in black. As shown in FIG. 13, it is a display state diagram of the display panel in the T2 time period, where GOAn is the pixel unit area connected with the n-th stage shift register unit. In the T2 period, the fifth stage shift register unit outputs a high level signal. Therefore, in the T2 period, the pixel units in the GOA5, GOA6, GOA7, and GOA8 areas do not emit light, that is, in the T2 period, GOA5, GOA6, GOA7, GOA8 area inserted in black.

Under the fourth driving mode, a fourth initial signal is input to the input terminal of the first stage shift register, and a second logic level is input to the first control signal terminal, the second control signal terminal, and the third control signal terminal, to turn on the second switch units in the first to seventh stage switch unit groups and simultaneously turn off the first switch units in the first to seventh stage switch unit groups. In the embodiment, the first logic level is a high level, and the second logic level is a low level. Under the fourth driving mode, the second stage shift register unit, the third stage shift register unit, the fourth stage shift register unit, the fifth stage shift register unit, the sixth stage shift register unit, and the seventh stage shift register unit and the eighth stage shift register unit will not output shift signals. At the same time, since the output terminal of the first stage shift register unit is connected to the input terminals of the second stage shift register unit, the third stage shift register unit, the fourth stage shift register unit, the fifth stage shift register unit, the sixth stage shift register unit, the seventh stage shift register unit and the eighth stage shift register unit, the first stage shift register unit may provide enable signals to the plurality of rows of pixel units corresponding to the second stage shift register unit, the third stage shift register unit, the fourth stage shift register unit, the fifth stage shift register unit, the sixth stage shift register unit, the seventh stage shift register unit and the eighth stage shift register unit.

As shown in FIG. 14, it is a timing diagram of each node of the gate driving circuit shown in FIG. 4 under the fourth driving state, where Out1 is the timing diagram of the output terminal of the first stage shift register unit GOA1; Out2 is the timing diagram of the output terminal of the second stage shift register unit GOA2; Out3 is the timing diagram of the output terminal of the third stage shift register unit GOA3; Out4 is the timing diagram of the output terminal of the fourth stage shift register unit GOA4; Out5 is the timing diagram of the output terminal of the fifth stage shift register unit GOA5; Out6 is the timing diagram of the output terminal of the sixth stage shift register unit GOA6; Out7 is the timing diagram of the output terminal of the seventh stage shift register unit GOA7; and Out8 is the timing diagram of the output terminal of the eighth stage shift register unit GOA8. In the T1 time period, the output terminal of the first stage shift register unit GOA1 outputs a high level signal, the pixel units correspondingly connected with the output terminals of the first, second, third, fourth, fifth, sixth, seventh and eighth stage shift register units receive a high level enable signal, therefore, the display panel does not emit light in the full screen during the T1 period. In the T2 period, the first shift register unit outputs a low level signal, the pixel units correspondingly connected with the output terminals of the first, second, third, fourth, fifth, sixth, seventh and eighth stage shift register units receive a low level enable signal, therefore, the display panel emits light in the full screen during the T2 period. The fourth driving mode is the black insertion manner between frames described in the related art.

On the one hand, the gate driving circuit can control the gate driving circuit to switch between different driving modes through the first control signal terminal, the second control signal terminal and the third control signal terminal. On the other hand, when the gate driving circuit operates in the first driving mode, the second driving mode, and the third driving mode, the display panel can realize the rolling black insertion, thereby avoiding the technical problem of the dynamic blur of pictures of the display panel; on another hand, compared with the black insertion manner between frames in the related art, this rolling black insertion manner may increase the light-emitting duration of each pixel unit, thereby avoiding problems such as flickering and low display brightness of images of the display panel.

Under each of the above-mentioned driving modes, effective duration of the high level output by the first stage shift register unit needs to be different. For example, under the first driving mode, the effective duration of the high level output by the first stage shift register unit needs to cover the data writing period of the plurality of rows of pixel units correspondingly arranged with the first stage shift register unit. Under the second driving mode, the effective duration of the high level output by the first stage shift register unit needs to cover the data writing period of the plurality of rows of pixel units correspondingly arranged with the first stage shift register unit and the second stage shift register unit. Under the third driving mode, the effective duration of the high level output by the first stage shift register unit needs to cover the data writing period of the plurality of rows of pixel units correspondingly arranged with the first stage shift register unit, the second stage shift register unit, the third stage shift register unit and the fourth stage shift register unit. Under the fourth driving mode, the effective duration of the high level output by the first stage shift register unit needs to cover the data writing period of all the pixel units. Therefore, correspondingly, under different driving modes, different initialization signals need to be input to the first shift register unit. The duration of the high level output by the first stage shift register unit may also be adjusted through the clock control signal when necessary.

In this exemplary embodiment, the gate driving circuit may be arranged corresponding to the pixel driving circuit in FIG. 1. It should be understood that in other exemplary embodiments, the gate driving circuit provided by the present disclosure may also be arranged corresponding to other pixel driving circuits. For example, the pixel driving circuit may have a pixel structure such as 2T1C, 7T1C, or the like.

Figure 15:
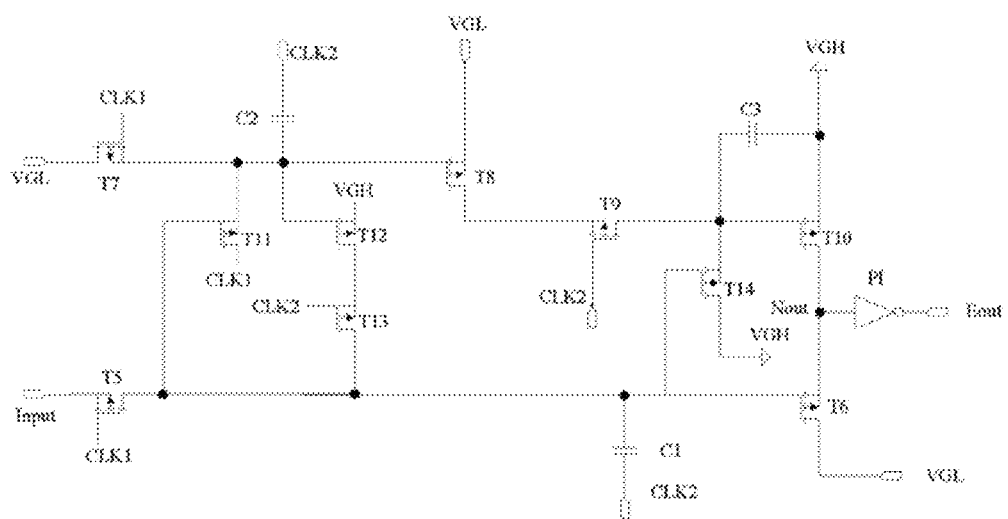
FIG. 15 is a schematic structural diagram of a shift register unit in an exemplary embodiment of the gate driving circuit of the present disclosure.
Figure 16:
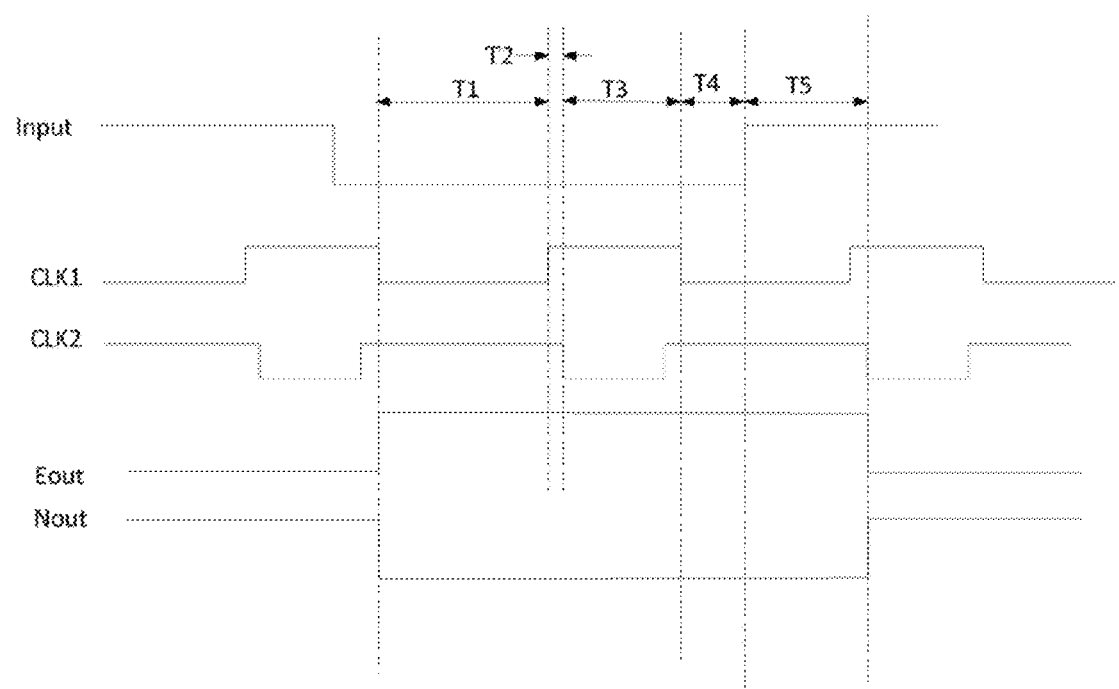
FIG. 16 is a timing diagram of some nodes in an exemplary embodiment of the shift register unit in FIG. 15.

As shown in FIGS. 15 and 16, FIG. 15 is a schematic structural diagram of a shift register unit in an exemplary embodiment of the gate driving circuit of the present disclosure; FIG. 16 is a timing diagram of some nodes in an exemplary embodiment of the shift register unit in FIG. 15. The shift register unit includes a fifth transistor T5 to a fourteenth transistor T14, a first capacitor C1 to a third capacitor C3, and an inverter PI. As shown in FIG. 15, the fifth transistor T5 to the fourteenth transistor T14 may be P-type transistors, the first power signal terminal VGL remains a low level, and the second power signal terminal VGH remains a high level. As shown in FIG. 16, a driving mode of the shift register unit includes 5 stages. In the first stage T1, the first clock signal terminal CLK1 is at a low level, the second clock signal terminal CLK2 is at a high level, and the input terminal is at a low level, the fifth transistor T5, the sixth transistor T6 and the fourteenth transistor T14 are turned on, the second power supply terminal VGH precharges a high level signal to the third capacitor C3, and the output terminal Eout is at high level. In the second stage T2, the first clock signal terminal CLK1 is at a high level, the second clock signal terminal CLK2 is at a high level, the input terminal Input is at a low level, the eleventh transistor T11 is turned on, and the first clock signal terminal charges a high level signal to the capacitor C2, to turn off the twelfth transistor T12, and the output terminal Eout outputs a high level. In the third stage T3, the first clock signal terminal CLK1 is at a high level, the second clock signal terminal CLK2 is at a low level in the front part of the third stage T3, the input terminal is at a low level, the eighth transistor T8 is turned off under action of the high level of the capacitor C2, and the output terminal Eout outputs a high level. In the fourth stage T4, the first clock signal terminal CLK1 is at a low level, the second clock signal terminal CLK2 is at a high level, the input terminal Input is at a low level, the fifth transistor T5, the sixth transistor T6, the seventh transistor T7 and the eleventh transistor T11 are turned on, the first power supply terminal VGL and the first clock signal terminal precharges a low level to the second capacitor C2, and the output terminal Eout outputs a high level. In the fifth stage T5, the first clock signal terminal CLK1 is at a low level in the front part of the fifth stage T5, and the second clock signal terminal CLK2 is at a high level, the input terminal Input is at a high level, the fifth transistor T5 is turned on, the sixth transistor T6 and the eleventh transistor T11 are turned off, and the output terminal Eout maintains the high level of the previous stage. After the fifth stage T5, the second clock signal terminal CLK2 becomes a low level, the eighth transistor T8, the ninth transistor T9 and the tenth transistor T10 are turned on, and the output terminal Eout outputs a low level.

In this exemplary embodiment, the shift register unit is used to output a shift signal. It should be understood that in other exemplary embodiments, the shift register unit may also have more structures to select, which belongs to the protection scope of this disclosure.

Figure 17:
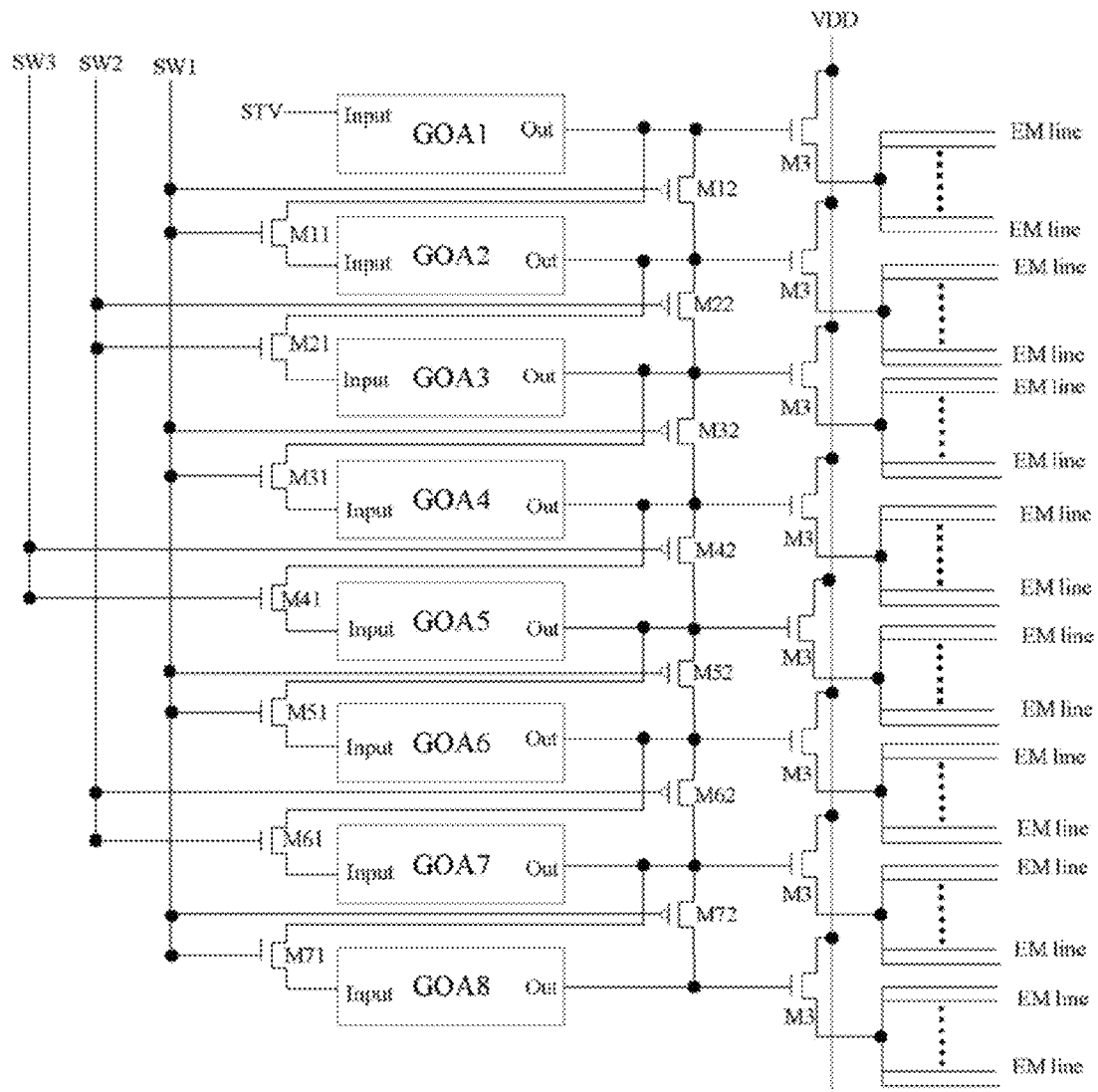
FIG. 17 is a schematic structural diagram of another exemplary embodiment of the gate driving circuit of the present disclosure.

In this exemplary embodiment, as shown in FIG. 17, it is a schematic structural diagram of another exemplary embodiment of the gate driving circuit of the present disclosure. The gate driving circuit may further include: a first power supply terminal VDD and a plurality of third switch units M3. The third switch units M3 is arranged in a one-to-one correspondence with the shift register units, and the third switch unit M3 is connected with the first power supply terminal VDD, the output terminal Out of the shift register unit, and the plurality of enable signal lines, for transmitting the first power supply terminal VDD to the plurality of enable signal lines in response to a signal from the output terminal Out of the shift register unit. In the embodiment, each enable signal line is used to provide the enable signal to one row of pixel units. The third switch unit M3 may be an N-type transistor, and this arrangement may enhance the output capability of the gate driving circuit through the first power supply terminal VDD. It should be understood that if the effective level output by the shift register unit is a low level, the third switch unit may be set as a P-type transistor, and logic conversion on the level input to the enable signal line may also be performed by the third switch unit.

Figure 18:
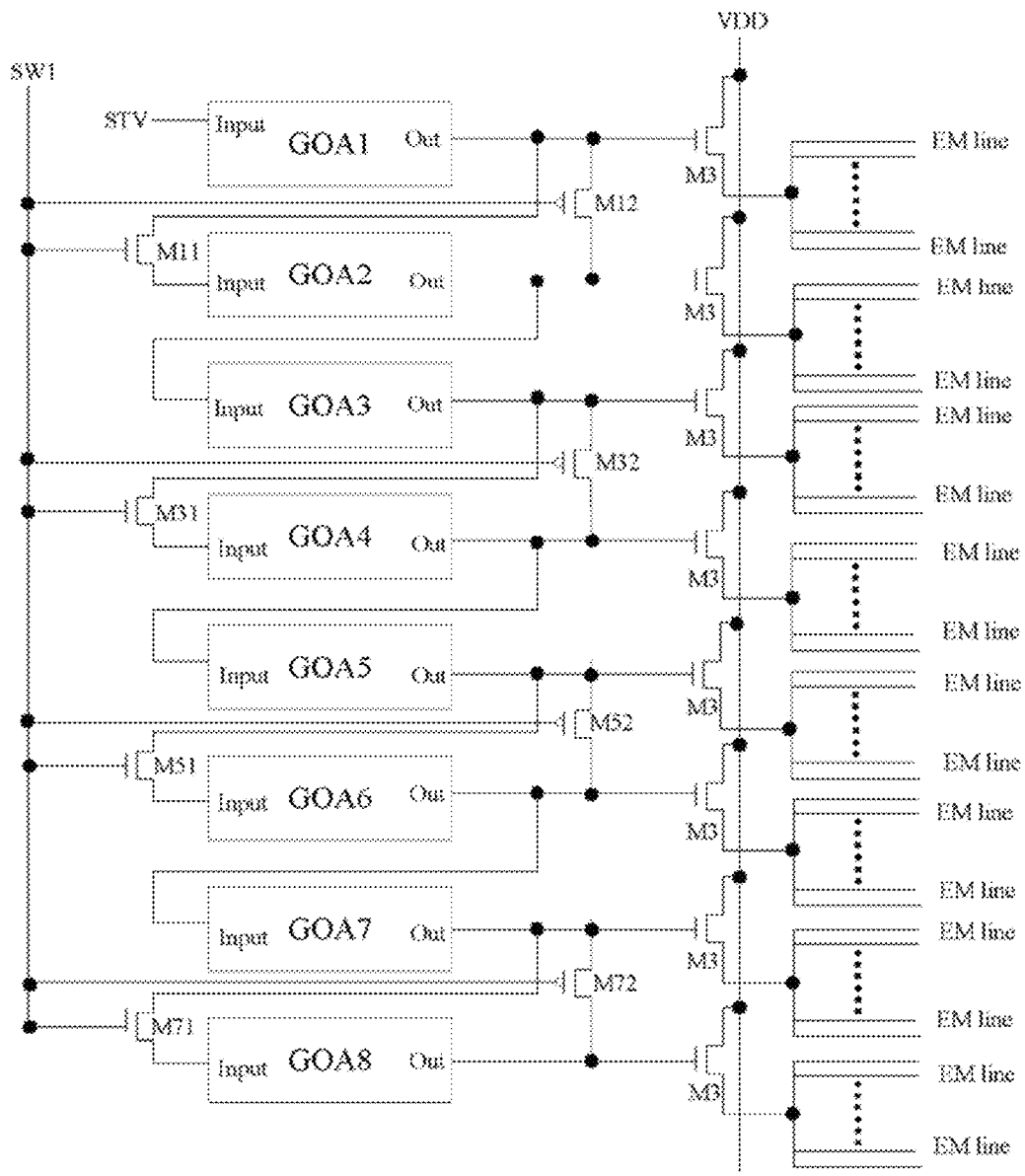
FIG. 18 is a schematic structural diagram of another exemplary embodiment of a gate driving circuit of the present disclosure.

In this exemplary embodiment, the number of switch unit groups may also be other numbers, and it is not necessary to provide a switch unit group between each adjacent shift register unit. For example, as shown in FIG. 18, it is a schematic structural diagram of another exemplary embodiment of a gate driving circuit of the present disclosure. In this exemplary embodiment, the switch unit groups are only provided between the first stage shift register unit and the second stage shift register unit, between the third stage shift register unit and the fourth stage shift register unit, between the fifth stage shift register unit and the sixth stage shift register unit, between the seventh stage shift register unit and the eighth stage shift register unit; no switch unit groups are provided between the second stage shift register unit and the third stage shift register unit, between the fourth stage shift register unit and the fifth stage shift register unit, or between the sixth stage shift register unit and the seventh stage shift register unit. In this exemplary embodiment, the gate driving circuit may be controlled to operate under the above-mentioned first driving mode and second driving mode by controlling the logic level output from the first control signal terminal SW1. When the first control signal terminal SW1 outputs a high level signal, the gate driving circuit operates under the above-mentioned first driving mode; when the first control signal terminal SW1 outputs a low level signal, the gate driving circuit operates under the above-mentioned second driving mode.

In this exemplary embodiment, the number of shift register units may also be other numbers. For example, there may be $m*2^n$ shift register units, wherein m is a positive integer greater than or equal to 2, and n is a positive integer greater than or equal to 1. One switch unit group may be arranged between each of adjacent shift registers, wherein a switch unit group of an N-th stage is arranged between a shift register unit of an N-th stage and a shift register unit of an (N+1)-th stage. The switch unit groups of (km+M)-th stages are commonly connected to a first control signal terminal, k is a positive integer greater than or equal to 0, M is a positive integer less than m and greater than 0, and km+M is less than or equal to $m*2^n$. The switch unit groups of $(2^q*m+2^{q+1}*m*p)$ stages are commonly connected to a (q+2)-th control signal terminal, wherein q and p are positive integers greater than or equal to 0, and $2^q*m+2^{q+1}*m*p$ is less than or equal to $m*2^n$. For example, when m=3 and n=3, the first stage switch unit group, the second stage switch unit group, the fourth stage switch unit group, the fifth stage switch unit group, the seventh stage switch unit group, the eighth stage switch unit group, the tenth stage switch unit group, the eleventh stage switch unit group, the thirteenth stage switch unit group, the fourteenth stage switch unit group, the sixth stage switch unit group, the seventeenth stage switch unit group, the nineteenth stage switch unit group, the twentieth stage switch unit group, the twenty-second stage switch unit group and the twenty-third stage switch unit group are commonly connected to the first control signal terminal; the third stage switch unit group, the ninth stage switch unit group, the fifteenth stage switch unit group and the twenty-first stage switch unit group are commonly connected to the second control signal terminal; the sixth stage switch unit group and the eighteenth stage switch unit group are commonly connected to the third control signal terminal; the twelfth stage switch unit group is commonly connected to the fourth control signal terminal. The gate driving circuit may realize five different driving modes by controlling the signals from the first control signal terminal to the fourth control signal terminal. In the embodiment, the symbol "*" represents a multiplication sign.

Figure 19:
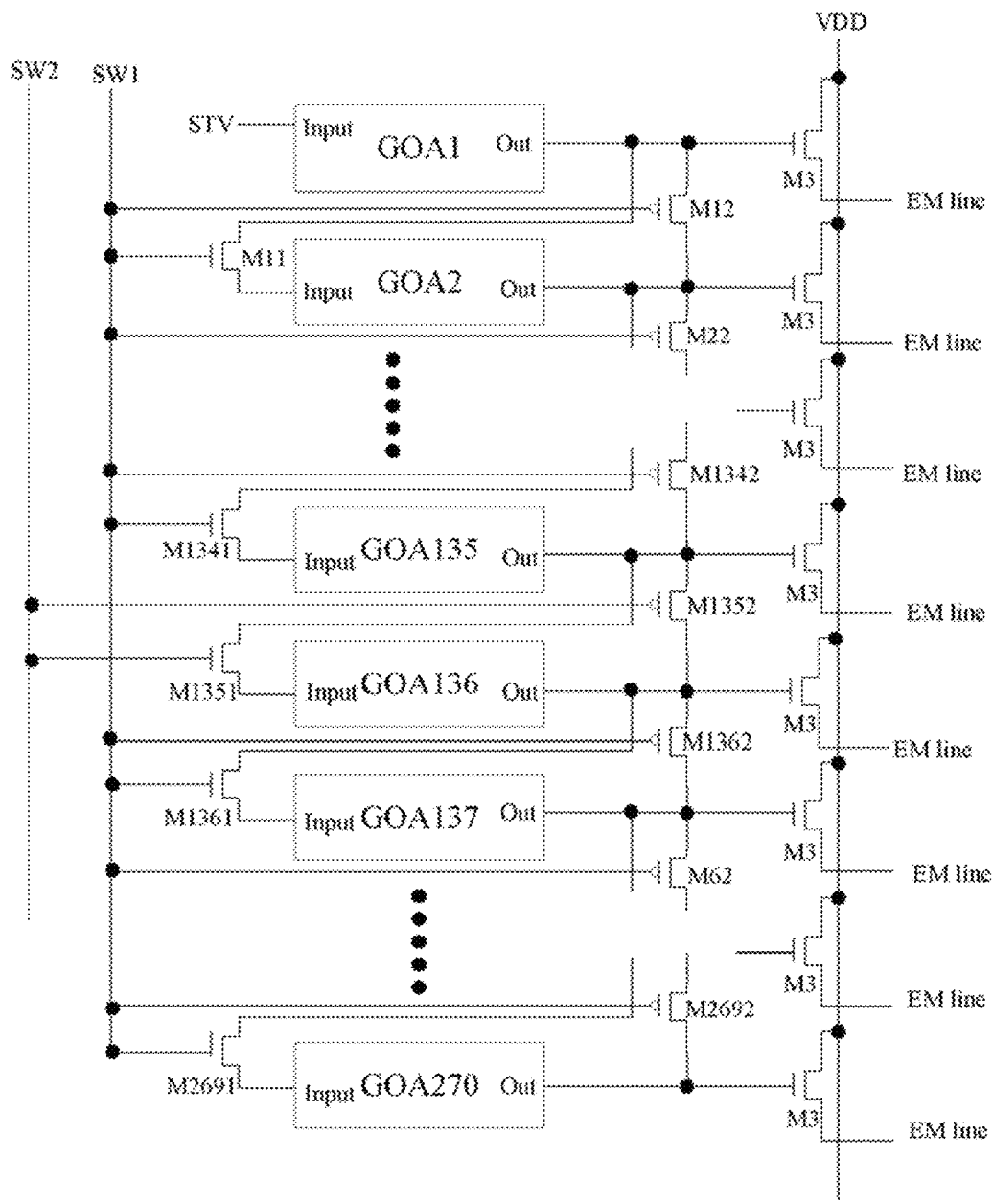
FIG. 19 is a schematic structural diagram of another exemplary embodiment of the gate driving circuit of the present disclosure.

In this exemplary embodiment, each shift register unit may be arranged corresponding to a row of pixel units, and each shift register unit is used to provide an enable signal to a row of pixel units. As shown in FIG. 19, it is a schematic structural diagram of another exemplary embodiment of the gate driving circuit of the present disclosure. The display panel may include 270 rows of pixel units. Correspondingly, the gate driving circuit may include 270 ($m*2^n$, m equals to 135, n equals to 1) cascaded shift register units. The (km+M)-th stage switch unit groups are commonly connected to the first control signal terminal. That is, the control signal terminals of the first stage switch unit group to the 134th stage switch unit group, and the 136th stage switch unit group to the 269th stage switch unit group are connected to the first control signal terminal SW1, the ($2^q*m+2^{q+1}*m*p$)-th stage switch unit groups are commonly connected to the (q+2)-th control signal terminal. That is, the control signal terminal of the 135th stage switch unit group is connected to the second control signal terminal SW2.

The gate driving circuit may operate under three driving modes.

Figure 20:
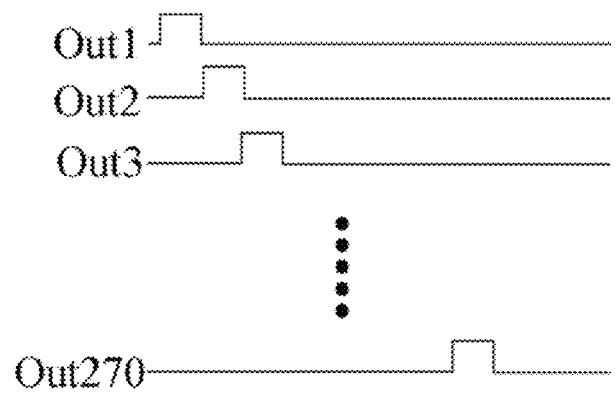
FIG. 20 is a timing diagram of each node of the gate driving circuit of FIG. 19 under the first driving state.

As shown in FIG. 20, it is a timing diagram of each node of the gate driving circuit of FIG. 19 under the first driving state, where Out1 is the timing diagram of the output terminal of the first stage shift register unit GOA1; Out2 is the timing diagram of the output terminal of the second stage shift register unit GOA2; Out3 is the timing diagram of the output terminal of the third stage shift register unit GOA3; . . . Out270 is the timing diagram of the output terminal of the 270th stage shift register unit GOA270. Under the first driving mode, both the first control signal terminal and the second control signal terminal input high level signals, the first switch unit in each switch unit group is turned on, the second switch unit in each switch unit group is turned off. Each shift register unit of the gate driving circuit outputs a shift signal stage by stage, so that each pixel unit lights up row by row.

Figure 21:
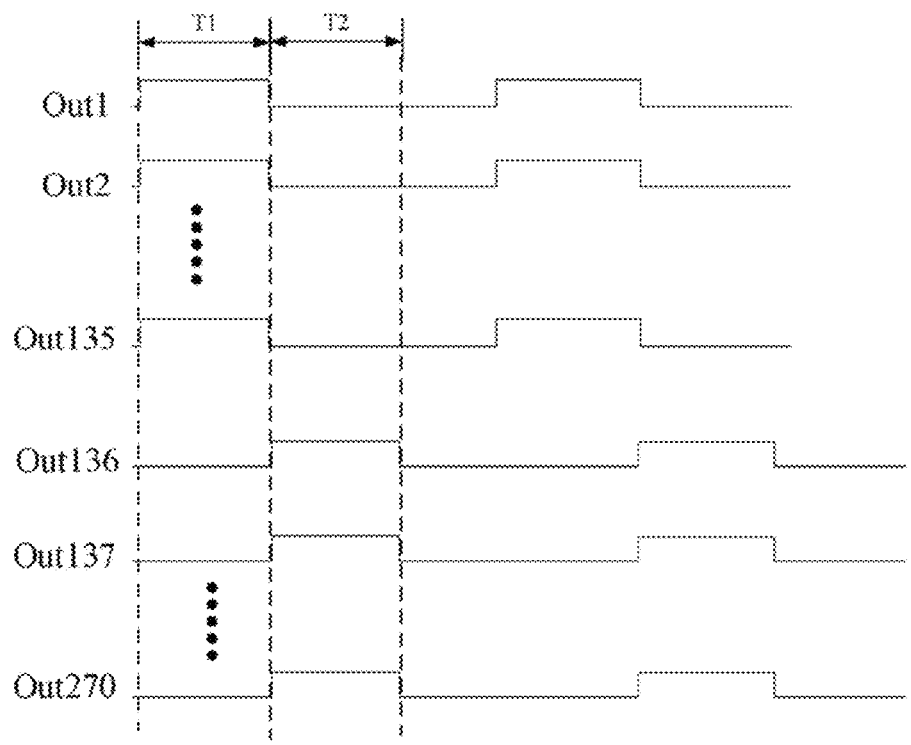
FIG. 21 is a timing diagram of each node of the gate driving circuit of FIG. 19 under the first driving state.

As shown in FIG. 21, it is a timing diagram of each node of the gate driving circuit of FIG. 19 under the first driving state, where Out1 is the timing diagram of the output terminal of the first stage shift register unit GOA1; Out2 is the timing diagram of the output terminal of the second stage shift register unit GOA2; . . . Out135 is the timing diagram of the output terminal of the 135th stage shift register unit GOA135; Out136 is the timing diagram of the output terminal of the 136th stage shift register unit GOA136; . . . Out270 is the timing diagram of the output terminal of the 270th stage shift register unit GOA270. Under the second driving mode, the first control signal terminal SW1 inputs a low level signal, the second control signal terminal inputs a high level signal, and the output terminals of the first stage shift register unit to the 135th stage shift register unit are shorted, and the output terminals of the 136th stage shift register unit to the 270th stage shift register unit are shorted. During the T1 period, the first stage shift register unit to the 135th stage shift register unit output high levels, and the pixel units corresponding to the first stage shift register unit to the 135th stage shift register unit are in the black insertion stage. During the T2 period, the first stage shift register unit to the 135th stage shift register unit output low levels, and the pixel units corresponding to the first stage shift register unit to the 135th stage shift register unit are in the lighting stage. At the same time, the 136th stage shift register unit to the 270th stage shift register unit output high levels, and the pixel units corresponding to the 136th stage shift register unit to the 270th stage shift register unit are in the black insertion stage.

Figure 22:
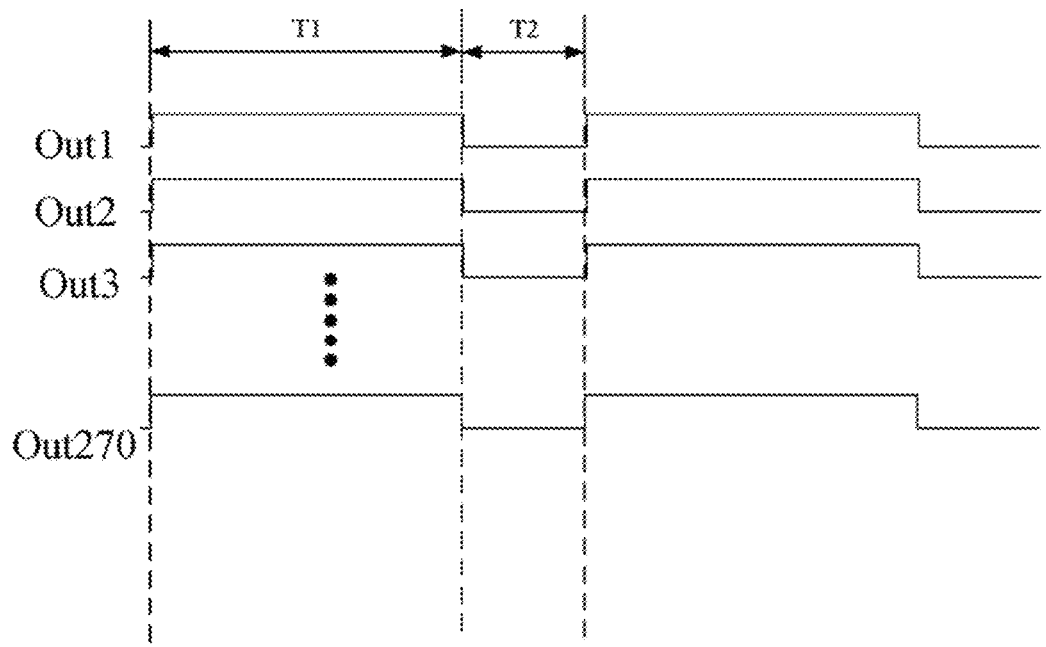
FIG. 22 is a timing diagram of each node of the gate driving circuit of FIG. 19 under the first driving state.

As shown in FIG. 22, it a timing diagram of each node of the gate driving circuit of FIG. 19 under the first driving state, where Out1 is the timing diagram of the output terminal of the first stage shift register unit GOA1; Out2 is the timing diagram of the output terminal of the second stage shift register unit GOA2; Out3 is the timing diagram of the output terminal of the third stage shift register unit GOA3; . . . Out270 is the timing diagram of the output terminal of the 270th stage shift register unit GOA270. Under the third driving mode, both the first control signal terminal and the second control signal terminal input low level signals, the first switch unit in each switch unit group is turned off, the second switch unit in each switch unit group is turned on, and the output terminal of each shift register unit is short-circuited. In the T1 period, the shift register unit of each stage outputs a high level, and the display panel does not emit light on the full screen. In the T2 period, the shift register unit of each stage outputs a low level, and the display panel emits light on the full screen. The third driving mode is the black insertion manner between frames described in the related art.

It should be understood that, in other exemplary embodiments, the display panel may further include pixel units of other rows, and the switch unit groups may also share the control signal terminal in other ways. For example, the display panel may include 1080 rows of pixel units. Correspondingly, the gate driving circuit includes 1080 ($m*2^n$, m equals to 135, n equals to 3) stage shift register units. The (km+M)-th stage switch unit groups are commonly connected to the first control signal terminal. That is, the control signal terminals of the first stage switch unit group to the 134th stage switch unit group, the 136th stage switch unit group to the 269th stage switch unit group, . . . the 946th stage switch unit group to the 1079th stage switch unit group are connected to the first control signal terminal, the ($2^q*m+2^{q+1}*m*p$)-th stage switch unit groups of are commonly connected to the (q+2)-th control signal terminal. That is, the control signal terminals of the 135th stage switch unit group, the 405th stage switch unit group, the 675th stage switch unit group and the 945th stage switch unit group are connected to the second control signal terminal. The control signal terminals of the 270th stage switch unit group and the 810th stage switch unit group are connected to the third control signal terminal. The control signal terminal of the 540th stage switch unit group is connected to the fourth control signal terminal. The gate driving circuit may achieve the switch of five driving modes.

This exemplary embodiment further provides a driving method of driving the above-mentioned gate driving circuit, and the driving method includes following steps.

In a driving period, a first switch unit or a second switch unit in one switch unit group is selectively turned on.

In the exemplary embodiment, m=2 and n=2, the driving method may include:

under a first driving mode, inputting a first initial signal to an input terminal of a first stage shift register, and inputting a first logic level to a first control signal terminal, a second control signal terminal, and a third control signal terminal, to turn on the first switch units in the first to seventh stage switch unit groups and simultaneously turn off the second switch units in the first to seventh stage switch unit groups;

under a second driving mode, inputting a second initial signal to the input terminal of the first stage shift register, and inputting a second logic level to the first control signal terminal, to turn on the second switch units in the first, third, fifth and seventh stage switch unit groups, and simultaneously inputting a first logic level to the second control signal terminal and the third control signal terminal, to turn on the first switch units in the second, sixth and fourth stage switch unit groups;

under a third driving mode, inputting a third initial signal to the input terminal of the first stage shift register, and inputting a second logic level to the first control signal terminal and the second control signal terminal, to turn on the second switch units in the first, third, fifth, seventh, second and sixth stage switch unit groups, and simultaneously inputting a first logic level to the third control signal terminal, to turn on the first switch unit in the fourth stage switch unit group; and under a fourth driving mode, inputting a fourth initial signal to the input terminal of the first stage shift register, and inputting a second logic level to the first control signal terminal, the second control signal terminal, and the third control signal terminal, to turn on the second switch units in the first to seventh stage switch unit groups and simultaneously turn off the first switch units in the first to seventh stage switch unit groups.

The driving method of the gate driving circuit provided by this exemplary embodiment has the same technical features and operating principles as the above-mentioned gate driving circuit, the above content has been described in detail, which will not be repeated herein.

This exemplary embodiment further provides a display panel including the above-mentioned gate driving circuit.

In this exemplary embodiment, the display panel is a silicon-based OLED display panel. The silicon-based OLED display panel may be applied to display devices such as VR/AR.

Figure 23:
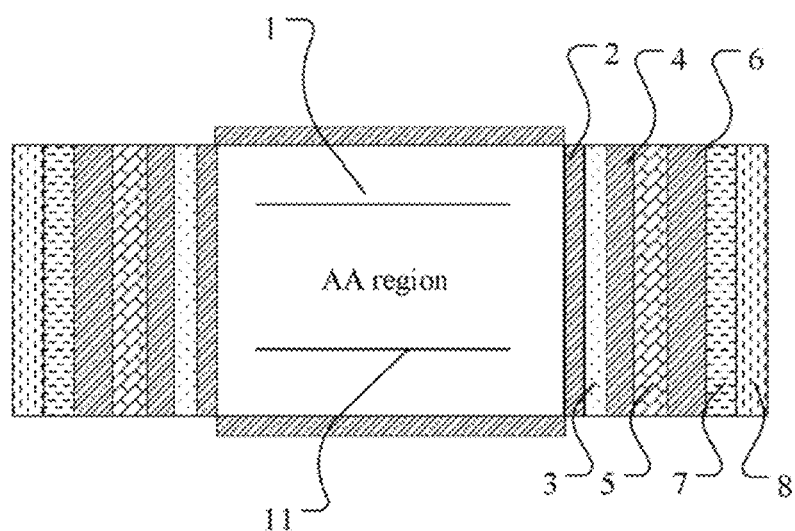
FIG. 23 is a schematic structural diagram of an exemplary embodiment of a silicon-based OLED display panel of the present disclosure.

As shown in FIG. 23, a schematic structural diagram of an exemplary embodiment of a silicon-based OLED display panel of the present disclosure is shown. The silicon-based OLED display panel includes: a display area 1, a first virtual area 2, a detection area 3, a second virtual area 4, a cathode ring area 5, a third virtual area 6, a first driving circuit integration area 7 and a second driving circuit integration area 8. Enable signal lines 11 are integrated in the display area 1. The first virtual area 2 is located around the display area 1. The detection area 3 is located at a side of the first virtual area away from the display area, and located at one side or two sides of the display area along an extension direction of the enable signal line 11. The second virtual area 4 is located at a side of the detection area away from the display area. The cathode ring area 5 is located at a side of the second virtual area away from the display area. The third virtual area 6 is located at a side of the cathode ring area away from the display area. The first driving circuit integration area 7 is located at a side of the third virtual area away from the display area, for integrating a first gate driving circuit, wherein the first gate driving circuit is used for generating a gate driving signal. The second driving circuit integration area 8 is located at a side of the first driving circuit integration area away from the display area, for integrating the gate driving circuit described above. Due to the manufacturing process of the semiconductor, among the plurality of semiconductors formed through multiple patterning processes, uniformity of the semiconductor at an edge is poor. In this exemplary embodiment, a semiconductor with the same structure as that in the display area 1 may be integrated in the first virtual area 1, so that the semiconductor in the display area is away from the edge area, thereby improving the uniformity of the semiconductor in the display area 1. A detection circuit may be integrated in the detection area 3, to detect an operating current of the display panel. The cathode ring area 2 is used to integrate a cathode ring and a pixel driving circuit, and the cathode ring is arranged on the same layer as the common cathode to connect the cathode of the light-emitting unit to the power supply terminal of the pixel driving circuit through a via hole. Semiconductors are integrated in the second virtual area 4 and the third virtual area 6 to improve the uniformity of the semiconductor in the cathode ring area 2. As shown in FIG. 23, the detection area 3, the second virtual area 4, the cathode ring area 5, the third virtual area 6, the first driving circuit integration area 7 and the second driving circuit integration area 8 can be arranged at opposite sides of the display area. It should be understood that, in other exemplary embodiments, the detection area 3, the second virtual area 4, the cathode ring area 5, the third virtual area 6, the first driving circuit integration area 7 and the second driving circuit integration area 8 may also be set at only one side of the display area.

After considering the specification and practicing the disclosure disclosed herein, those skilled in the art will easily think of other embodiments of the present disclosure. This application is intended to cover any variations, uses, or adaptive changes of the present disclosure which follow the general principles of the present disclosure and include common knowledge or conventional technical means in the technical field not disclosed in the present disclosure. The description and embodiments are only regarded as exemplary, and the true scope and spirit of the present disclosure are pointed out by the appended claims.

What is claimed is:

1. A gate driving circuit applied to a display panel, the display panel comprising a plurality of rows of pixel units, wherein the gate driving circuit comprises:

a plurality of shift register units, wherein the shift register units are arranged in cascade, an output terminal of the shift register unit of a previous stage is connected to an input terminal of the shift register unit of an adjacent next stage, each of the shift register units and at least one row of pixel units are correspondingly arranged, for inputting an enable signal to the corresponding at least one row of pixel units; and switch unit groups arranged between each adjacent two shift register units, and the switch unit group comprising:

a first switch unit connected to an output terminal of the shift register unit of a previous stage and an input terminal of the shift register unit of an adjacent next stage, to turn on the output terminal of the shift register unit of the previous stage and the input terminal of the shift register unit of the adjacent next stage in response to a control signal; and a second switch unit connected to an output terminal of the shift register unit of a previous stage and an output terminal of the shift register unit of an adjacent next stage, to turn on the output terminal of the shift register unit of the previous stage and the output terminal of the shift register unit of the adjacent next stage in response to a control signal, wherein the first switch unit and the second switch unit are turned on selectively under action of different control signal terminals during a driving period, wherein the gate driving circuit further comprises:
a first power supply terminal; and
a plurality of third switch units, arranged in a one-to-one correspondence with the shift register units, and the third switch unit is connected to the first power supply terminal, the output terminal of the shift register unit, and at least one enable signal line, for transmitting the first power supply terminal to the at least one enable signal line in response to a signal from the output terminal of the shift register unit, and wherein the at least one enable signal line is used to provide the enable signal to one row of pixel units.

2. The gate driving circuit according to claim 1, wherein the first switch unit is further connected to a control signal terminal, for turning on the output terminal of the shift register unit of the previous stage and the input terminal of the shift register unit of the adjacent next stage in response to a signal of the control signal terminal;

the second switch unit is further connected to the control signal terminal, for turning on the output terminal of the shift register unit of the previous stage and the output terminal of the shift register unit of the adjacent next stage in response to a signal of the control signal terminal; and logics of turn-on levels of the first switch unit and the second switch unit are opposite.

3. The gate driving circuit of claim 2, wherein one switch unit group is arranged between each of adjacent shift registers, wherein a switch unit group of an N-th stage is arranged between a shift register unit of an N-th stage and a shift register unit of an (N+1)-th stage, and N is a positive integer greater than or equal to 1.

4. The gate driving circuit according to claim 3, wherein there are $m*2^n$ shift register units, wherein m is a positive integer greater than or equal to 2, and n is a positive integer greater than or equal to 1;

switch unit groups of (km+M)-th stages are commonly connected to a first control signal terminal, k is a positive integer greater than or equal to 0, M is a positive integer less than m and greater than 0, and km+M is less than or equal to $m*2^n$;

switch unit groups of ($2^q*m+2^{q+1}*m*p$) stages are commonly connected to a (q+2)-th control signal terminal; q and p are positive integers greater than or equal to 0, and $2^q*m+2^{q+1}*m*p$ is less than or equal to $m*2^n$; and the first control signal terminal and the (q+2)-th control signal terminal form the control signal terminal.

5. The gate driving circuit according to claim 4, wherein m is equal to 2, n is equal to 2;

the first stage switch unit group, the third stage switch unit group, the fifth stage switch unit group and the seventh stage switch unit group are commonly connected to the first control signal terminal;

the second stage switch unit group and the sixth stage switch unit group are commonly connected to the second control signal terminal; and the fourth stage switch unit group is connected to the third control signal terminal.

6. The gate driving circuit according to claim 2, wherein the first switch unit is a P-type transistor, and the second switch unit is an N-type transistor; or the first switch unit is an N-type transistor, and the second switch unit is a P-type transistor.

7. The gate driving circuit according to claim 6, wherein the first switch unit is a P-type transistor, a gate electrode of the first switch unit is connected to the control signal terminal, the first electrode of the first switch unit is connected to the output terminal of the shift register unit of the previous stage, and the second electrode of the first switch unit is connected to the input terminal of the shift register unit of the adjacent next stage;

the second switch unit is an N-type transistor, a gate electrode of the second switch unit is connected to the control signal terminal, the first electrode of the second switch unit is connected to the output terminal of the shift register unit of the previous stage, and the second electrode of the second switch unit is connected to the output terminal of the shift register unit of the adjacent next stage; or, the first switch unit is an N-type transistor, a gate electrode of the first switch unit is connected to the control signal terminal, the first electrode of the first switch unit is connected to the output terminal of the shift register unit of the previous stage, and the second electrode of the first switch unit is connected to the input terminal of the shift register unit of the adjacent next stage;

the second switch unit is a P-type transistor, a gate electrode of the second switch unit is connected to the control signal terminal, the first electrode of the second switch unit is connected to the output terminal of the shift register unit of the previous stage, and the second electrode of the second switch unit is connected to the output terminal of the shift register unit of the adjacent next stage.

8. The gate driving circuit according to claim 1, wherein each of the shift register units corresponds to a row of pixel units and is used to provide an enable signal to the corresponding row of pixel units.

9. The gate driving circuit according to claim 1, wherein each of the shift register units corresponds to a plurality of rows of pixel units, and is used to provide an enable signal to the corresponding plurality of rows of pixel units.

10. The gate driving circuit according to claim 9, wherein the number of rows of pixel units corresponding to each shift register unit is the same.

11. The gate driving circuit according to claim 9, wherein the plurality of rows of pixel units corresponding to the same shift register unit is arranged adjacently.

12. The gate driving circuit according to claim 1, wherein the output terminal of each shift register unit is connected to a plurality of enable signal lines, and each of the plurality of enable signal lines is used to provide the enable signal to one row of pixel units.

13. The gate driving circuit according to claim 1, wherein the third switch unit is a switch transistor, a gate electrode of the third switch unit is connected to the output terminal of the shift register unit, and a first electrode of the third switch unit is connected to the first power supply terminal and a second electrode of the third switch unit is connected to the at least one enable signal line.

14. A driving method for driving a gate driving circuit, comprising:
   providing a display panel where the gate driving circuit is applied to the display panel, the display panel comprising a plurality of rows of pixel units;
   providing the gate driving circuit, wherein the gate driving circuit comprises:
      a plurality of shift register units, wherein the shift register units are arranged in cascade, an output terminal of the shift register unit of a previous stage is connected to an input terminal of the shift register unit of an adjacent next stage, each of the shift register units and at least one row of pixel units are correspondingly arranged, for inputting an enable signal to the corresponding at least one row of pixel units; and
      switch unit groups arranged between each adjacent two shift register units, and the switch unit group comprising:
      a first switch unit connected to an output terminal of the shift register unit of a previous stage and an input terminal of the shift register unit of an adjacent next stage, to turn on the output terminal of the shift register unit of the previous stage and the input terminal of the shift register unit of the adjacent next stage in response to a control signal; and
      a second switch unit connected to an output terminal of the shift register unit of a previous stage and an output terminal of the shift register unit of an adjacent next stage, to turn on the output terminal of the shift register unit of the previous stage and the output terminal of the shift register unit of the adjacent next stage in response to a control signal, wherein the first switch unit and the second switch unit are turned on selectively during a driving period, wherein the gate driving circuit further comprises:
         a first power supply terminal; and
         a plurality of third switch units, arranged in a one-to-one correspondence with the shift register units, and the third switch unit is connected to the first power supply terminal, the output terminal of the shift register unit, and at least one enable signal line, for transmitting the first power supply terminal to the at least one enable signal line in response to a signal from the output terminal of the shift register unit,
         wherein the at least one enable signal line is used to provide the enable signal to one row of pixel units; and
         in a driving period, selectively turning on a first switch unit or a second switch unit in one switch unit group under action of different control signal terminals; and in a driving period, selectively turning on a first switch unit or a second switch unit in one switch unit group under action of different control signal terminals.

15. The driving method of the gate driving circuit according to claim 14, wherein there are $m*2^n$ shift register units, m=2 and n=2 and the driving method further comprises:
   under a first driving mode, inputting a first initial signal to an input terminal of a first stage shift register, and inputting a first logic level to a first control signal terminal, a second control signal terminal, and a third control signal terminal, to turn on the first switch units in the first to seventh stage switch unit groups and simultaneously turn off the second switch units in the first to seventh stage switch unit groups;
   under a second driving mode, inputting a second initial signal to the input terminal of the first stage shift register, and inputting a second logic level to the first control signal terminal, to turn on the second switch units in the first, third, fifth and seventh stage switch unit groups, and simultaneously inputting a first logic level to the second control signal terminal and the third control signal terminal, to turn on the first switch units in the second, sixth and fourth stage switch unit groups;
   under a third driving mode, inputting a third initial signal to the input terminal of the first stage shift register, and inputting a second logic level to the first control signal terminal and the second control signal terminal, to turn on the second switch units in the first, third, fifth, seventh, second and sixth stage switch unit groups, and simultaneously inputting a first logic level to the third control signal terminal, to turn on the first switch unit in the fourth stage switch unit group; and
   under a fourth driving mode, inputting a fourth initial signal to the input terminal of the first stage shift register, and inputting a second logic level to the first control signal terminal, the second control signal terminal, and the third control signal terminal, to turn on the second switch units in the first to seventh stage switch unit groups and simultaneously turn off the first switch units in the first to seventh stage switch unit groups.

16. A display panel, comprising:
   a gate driving circuit applied to a display panel having a plurality of rows of pixel units, the gate driving circuit comprising:
   a plurality of shift register units, wherein the shift register units are arranged in cascade, an output terminal of the shift register unit of a previous stage is connected to an input terminal of the shift register unit of an adjacent next stage, each of the shift register units and at least one row of pixel units are correspondingly arranged, for inputting an enable signal to the corresponding at least one row of pixel units; and
   switch unit groups arranged between each adjacent two shift register units, and the switch unit group comprising:
      a first switch unit connected to an output terminal of the shift register unit of a previous stage and an input terminal of the shift register unit of an adjacent next stage, to turn on the output terminal of the shift register unit of the previous stage and the input terminal of the shift register unit of the adjacent next stage in response to a control signal; and
      a second switch unit connected to an output terminal of the shift register unit of a previous stage and an output terminal of the shift register unit of an adjacent next stage, to turn on the output terminal of the shift register unit of the previous stage and the output terminal of the shift register unit of the adjacent next stage in response to a control signal, wherein the first switch unit and the second switch unit are turned on under action of different control signal terminals selectively during a driving period,
   wherein the gate driving circuit further comprises:
      a first power supply terminal; and
      a plurality of third switch units, arranged in a one-to-one correspondence with the shift register units, and the third switch unit is connected to the first power supply terminal, the output terminal of the shift register unit, and at least one enable signal line, for transmitting the first power supply terminal to the at least one enable signal line in response to a signal from the output terminal of the shift register unit, and wherein the at least one enable signal line is used to provide the enable signal to one row of pixel units.

17. The display panel according to claim 16, wherein the display panel is a silicon-based organic light-emitting diode (OLED) display panel.

18. The display panel according to claim 17, wherein the gate driving circuit is a first gate driving circuit and the silicon-based OLED display panel comprises:
   a display area integrated with enable signal lines;
   a first virtual area located around the display area;
   a detection area located at a side of the first virtual area away from the display area, and located at one side or two sides of the display area along an extension direction of the enable signal line;
   a second virtual area located at a side of the detection area away from the display area;
   a cathode ring area located at a side of the second virtual area away from the display area;
   a third virtual area located at a side of the cathode ring area away from the display area;
   a first driving circuit integration area located at a side of the third virtual area away from the display area for integrating a second gate driving circuit, wherein the second gate driving circuit is used for generating a gate driving signal; and
   a second driving circuit integration area located at a side of the first driving circuit integration area away from the display area for integrating the first gate driving circuit.

* * * * *